United States Patent
Tanaka et al.

(10) Patent No.: US 6,674,106 B2
(45) Date of Patent: Jan. 6, 2004

(54) DISPLAY DEVICE SUCH AS ELECTRO-OPTIC ELEMENT AND THIN FILM TRANSISTOR AND DISPLAY DEVICE MANUFACTURING METHOD

(75) Inventors: Tsutomu Tanaka, Kanagawa (JP); Minoru Nakano, Kanagawa (JP); Masahiro Fujino, Kanagawa (JP)

(73) Assignee: Sony Corporation (JP)

(*) Notice: Subject to any disclaimer, the term of this patent is extended or adjusted under 35 U.S.C. 154(b) by 164 days.

(21) Appl. No.: 09/792,080

(22) Filed: Feb. 26, 2001

(65) Prior Publication Data

US 2001/0017371 A1 Aug. 30, 2001

(30) Foreign Application Priority Data

Feb. 29, 2000 (JP) .................................... P2000-052877

(51) Int. Cl.$^7$ .................... H01L 27/148; H01L 21/00
(52) U.S. Cl. .................... 257/222; 257/59; 257/437; 438/57; 438/29
(58) Field of Search .................... 438/57, 24, 27, 438/29; 257/59, 222, 225, 72, E27.111, 432, 435, 437

(56) References Cited

U.S. PATENT DOCUMENTS 5,844,290 A * 12/1998 Furumiya .................... 257/432
5,879,958 A * 3/1999 Kawahata et al. ............ 438/30
6,424,388 B1 * 7/2002 Colgan et al. ................ 349/27
6,429,916 B1 * 8/2002 Nakata et al. .............. 349/106
6,468,826 B1 * 10/2002 Murakami et al. ............ 438/48

FOREIGN PATENT DOCUMENTS

JP  10020340 A * 1/1998
JP  411054763 A * 2/1999

* cited by examiner

Primary Examiner—Caridad Everhart
(74) Attorney, Agent, or Firm—Rader, Fishman & Grauer PLLC; Ronald P. Kananen

(57) ABSTRACT

A display device includes pixels disposed in a matrix on a transparent base plate. Each pixel includes an opening region, in which an electro-optic element for emitting light through the base plate is formed, and a non-opening region, in which a thin film transistor for driving the electro-optic element is formed. The non-opening region has a first film structure including the thin film transistor. The opening region has a second film structure extending from the first film structure and existing between the electro-optic element and the base plate. The second film structure is different from the first film structure so as to adjust the light passing through the opening region.

54 Claims, 17 Drawing Sheets

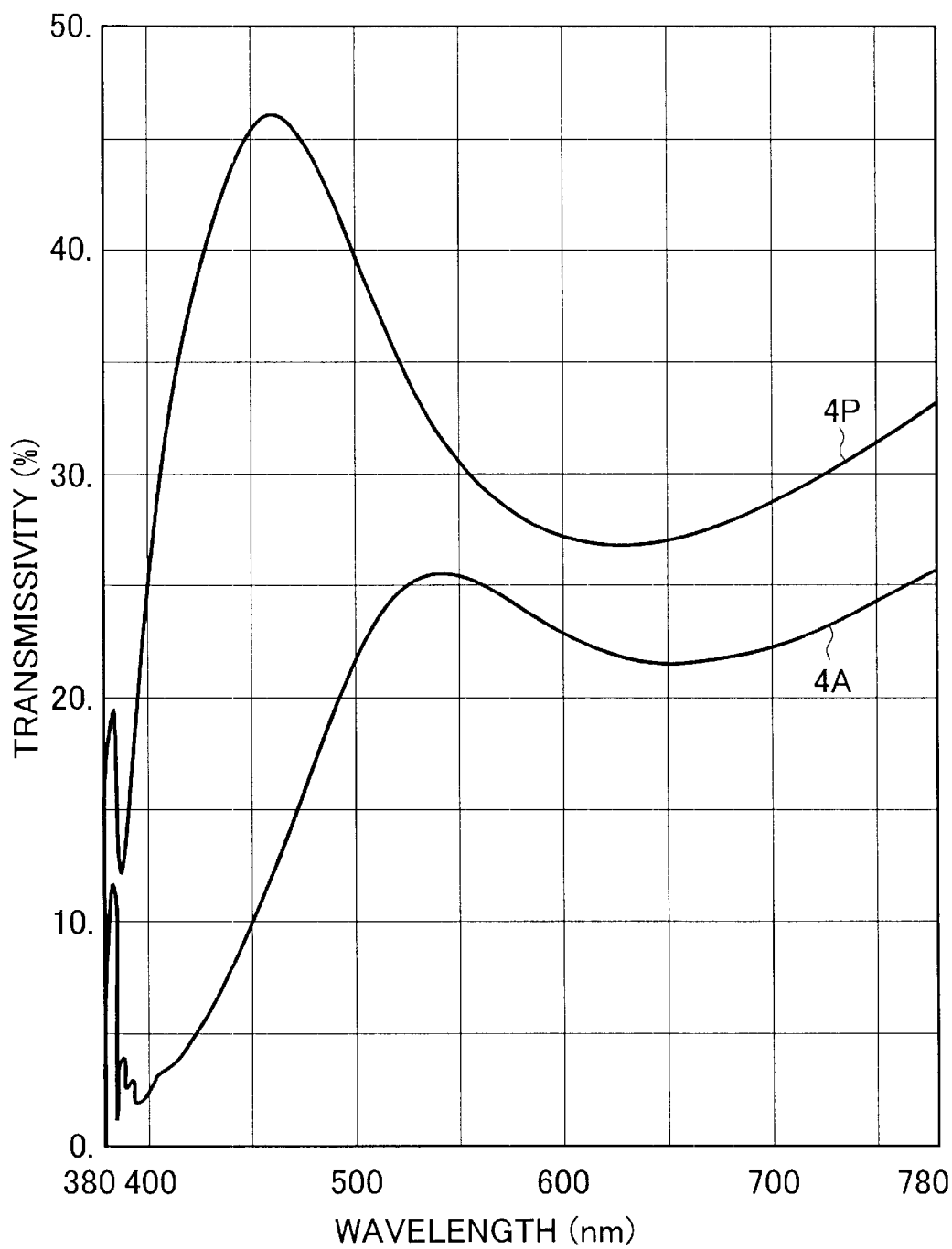

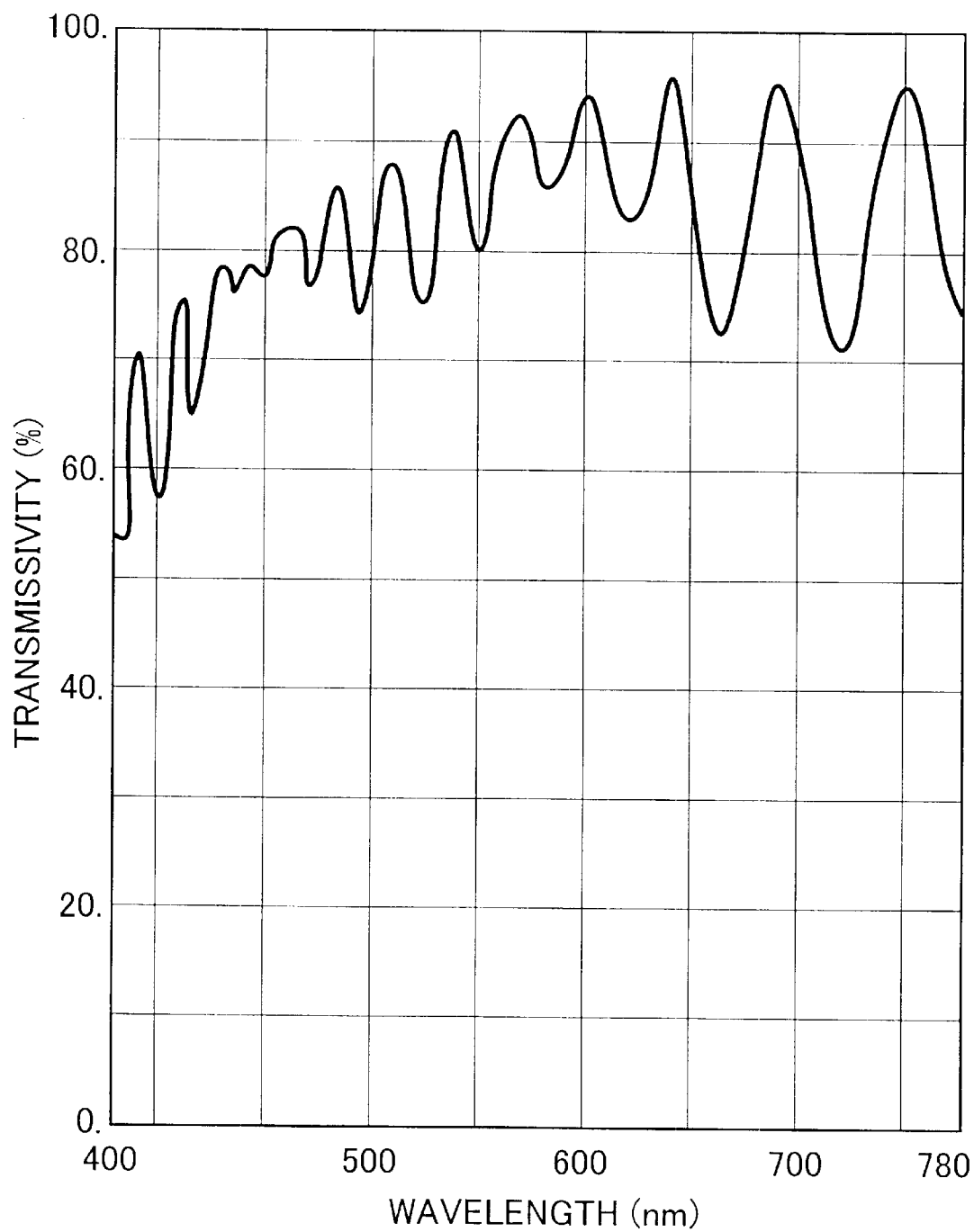

DISPLAY DEVICE SUCH AS ELECTROOPTIC ELEMENT AND THIN FILM TRANSISTOR AND DISPLAY DEVICE MANUFACTURING METHOD

BACKGROUND OF THE INVENTION

1. Field of the Invention

The present invention relates to a display device such as a liquid crystal display and an organic electroluminescent display and a display device manufacturing method. In particular, the present invention relates to a technique for improving optical characteristics of opening regions of a display device including pixels disposed in a matrix on a transparent base plate (substrate), each pixel having an opening region, in which an electro-optic element such as a liquid crystal cell and an organic electroluminescent element is formed, and a non-opening region, in which a thin film transistor for driving the electro-optic element is formed.

2. Description of the Related Art

FIG. 13 is a schematic partial sectional view showing a partial section of an example of a conventional active matrix type liquid crystal display device.

As shown in FIG. 13, a metal gate electrode 2 is formed on a base plate (substrate) 1 made of glass or the like. A gate insulation film 3 is formed so as to cover the gate electrode 2. On the gate insulation film 3, an amolphous semiconductor thin film 4A, which operates as an active layer of a thin film transistor, is formed. On one end side of the semiconductor thin film 4A, a drain electrode 5D is formed with an amolphous semiconductor thin film 4A(n+), which has a high impurity concentration and is made to have low resistance, inserted between the drain electrode 5D and the amolphous semiconductor thin film 4A. On the other end side of the amolphous semiconductor thin film 4A, a source electrode 5S is formed with another amolphous semiconductor thin film 4A(n+), which is also made to have low resistance, inserted between the source electrode 5S and the amolphous semiconductor thin film 4A. A protection film 8 is formed so as to cover the drain electrode 5D and the source electrode 5S. On the protection film 8, a pixel electrode 10 which comprises a transparent conductive film such as a film including indium tin oxide (ITO) as its main ingredient is formed to connect electrically with the drain electrode 5D through a contact hole CON.

The thin film transistor which is shown in FIG. 13 has a typical form of a bottom gate structure in which the amorphous semiconductor thin film 4A made of amorphous silicon or the like is used as its active layer. A thin film transistor having such a structure is called as a "reverse stagger channel etch type transistor".

FIG. 14 is a schematic partial sectional view showing a partial section of another example of a conventional display device. In FIG. 14, components corresponding to those of the prior art shown in FIG. 13 are designated by reference numerals corresponding to those in FIG. 13 for facilitating the understanding of them. Incidentally, in the following drawings, too, components corresponding to those shown in FIG. 13 are designated by reference numerals corresponding to those in FIG. 13 for facilitating the understanding of them.

The display device shown in FIG. 14 has basically the same structure as that shown in FIG. 13. However, the display device shown in FIG. 14 differs from the one shown in FIG. 13 in that a channel protection film 6 is formed on an amolphous semiconductor thin film 4A that functions as an active layer. The channel protection film 6 protects a part corresponding to a channel region of the active layer, which exists right above the gate electrode 2. The structure is called as a "reverse stagger channel protection type transistor".

FIG. 15 is a schematic partial sectional view showing a further example of a conventional display device.

A shading film 11 is formed on a base plate 1, and an amolphous semiconductor thin film 4A is formed above the shading film 11 with an undercoat film 12 inserted between the amolphous semiconductor thin film 4A and the shading film 11. A pixel electrode 10 is connected with one end of the semiconductor thin film 4A with an amolphous semiconductor thin film 4A(n+), which is made to have low resistance, inserted between the semiconductor thin film 4A and the pixel electrode 10. A source electrode 5S is connected with the other end of the semiconductor thin film 4A, similarly with an amolphous semiconductor thin film 4A(n+) inserted between the semiconductor thin film 4A and the source electrode 5S. The amolphous semiconductor thin film 4A, which functions as an active layer, is covered with a channel protection film 6 and a gate insulation film 3, and further a gate electrode 2 is formed on the gate insulation film 3.

The structure is the reverse of the prior arts described before in vertical positions of the amolphous semiconductor thin film 4A and the gate electrode 2, and then is called as a "forward stagger transistor".

FIG. 16 shows an improved type of the prior art shown in FIG. 13.

In the structure shown in FIG. 16, a thin film transistor is covered with a leveling film 9, and a pixel electrode 10 is formed on the leveling film 9. The structure is a "high numerical aperture type transistor using a leveling film".

A silicon nitride film or a silicon oxide film is frequently used as the gate insulation film 3 or the protection film 8 in the aforesaid prior art. Moreover, an organic resin film is frequently used as the leveling film 9.

The structures shown in FIGS. 13–16 are described in detail in, for example, "An Introduction to Liquid Crystal Display Engineering", The Nikkan Kogyo Shimbun, Ltd., 1998, pp. 27–30, "The Latest Liquid Crystal Process Technique in '99", Press Journal Inc., 1998, pp. 21–27, and "Flat Panel Display 1999", Nikkei Business Publications, Inc., 1998, pp. 118–131.

The aforesaid display devices use an amolphous semiconductor thin film as their active layers, however the prior art shown in FIG. 17 uses a polycrystalline semiconductor thin film such as a film including polysilicon as the main ingredient as its active layer.

A gate electrode 2 is formed on a glass base plate 1, and a polycrystalline semiconductor thin film 4P is formed above the gate electrode 2 with a gate insulation film 3 inserted between the polycrystalline semiconductor thin film 4P and the gate electrode 2. A part of the polycrystalline semiconductor thin film 4P placed right above the gate electrode 2 is formed as a channel region, and parts on both sides of the channel region are formed as a source region S and a drain region D, where impurities are injected in a high concentration. The semiconductor thin film 4P is covered with an interlayer insulation film 7, and a drain electrode 5D and a source electrode 5S are formed on the interlayer insulation film 7. These electrodes 5D and 5S are covered with a protection film 8.

Such a structure is called as a "bottom gate type transistor" because the gate electrode 2 is disposed below the active layer.

FIG. 18 shows a structure of a thin film transistor using a polycrystalline semiconductor thin film as its active layer in the same way as the above example. In the structure of this prior art, differently from the structure shown in FIG. 17, a gate electrode 2 is formed above a polycrystalline semiconductor thin film 4P with a gate insulation film 3 inserted between the gate electrode 2 and the semiconductor thin film 4P. Such a structure is called as a "top gate type transistor".

FIG. 19 shows a CMOS structure in which a top gate structure N-channel thin film transistor (N-channel TFT) is combined with a P-channel thin film transistor (P-channel TFT). The P-channel thin film transistor uses a polycrystalline semiconductor thin film 4 as an active layer, in which, for example, boron is injected into a source region S and a drain region D. The N-channel thin film transistor uses a polycrystalline semiconductor thin film 4 as an active layer, in which phosphorus or the like is injected into a source region S and a drain region D.

In the example, the N-channel thin film transistor is used for driving a pixel electrode 10. As for this structure, for suppressing a leak current, the so-called lightly doped drain (LDD) structure may be employed by forming regions, into which impurities are injected in a low concentration, between the drain region D and a central channel region and between the source region S and the central channel region.

These thin film transistors using polycrystalline semiconductor thin films as their active layers are described in detail in, for example, "The Latest Liquid Crystal Process Technique in '99", Press Journal Inc., 1998, pp. 53–59, and "Flat Panel Display 1999", Nikkei Business Publications, Inc., 1998, pp. 132–139. In any cases, a silicon nitride film or a silicon oxide film is frequently used as a gate insulation film, an interlayer insulation film and a protection film, all of which constituting a thin film transistor.

In a conventional active matrix type liquid crystal display, a pixel has an opening region including a pixel electrode 10 formed with a transparent conductive film and a non-opening region, where a thin film transistor for driving the pixel electrode is formed. The non-opening region has a film structure, which contains a thin film transistor, composed of a gate insulation film, an interlayer insulation film, a protection film and the like. The film structure extends to the opening region as it is, and the film structure is laid between the pixel electrode 10 and a glass base plate 1. The film structure includes a silicon nitride film, a silicon oxide film, an organic resin film, and the like. Although the refractive index of the silicon nitride film is within a range of 1.8 to 2.0, the refractive indices of the glass base plate, the silicon oxide film and the organic resin film are within a range of about 1.4 to 1.6. Consequently, in a case where these films having different refractive indices are configured into a multilayer structure, optical interference effects occur at interfaces.

FIG. 20 shows a spectrum of transmissivity of a film body in which a multilayer structure composed of a silicon nitride film, a silicon oxide film or the like is formed on a glass base plate. The spectrum is a spectrum in a visible light region of the light that has passed through a glass base plate on which a silicon nitride film (50 nm), a silicon oxide film (200 nm), a silicon nitride film (200 nm), an organic resin film (2 $\mu$m) and an ITO (50 nm) are laminated in the order from the bottom layer.

As apparent from the transmissivity spectrum, there appear interference phenomena that depend on refractive index differences between layers and film thicknesses. The interference causes the dispersion of wavelengths distribution of the transmitted light and a loss of the whole amount of the transmitted light. There exists a further problem that, because interference patterns vary in accordance with the dispersion of film thicknesses, the dispersion of colors occurs by respective display devices.

SUMMARY OF THE INVENTION

For resolving the aforesaid problems of the prior art, the following means is devised.

That is, a display device according to the present invention includes pixels disposed in a matrix on a transparent base plate, each pixel having an opening region, in which an electro-optic element for emitting light through the base plate is formed, and a non-opening region, in which a thin film transistor for driving the electro-optic element is formed, wherein the non-opening region has a first film structure including the thin film transistor, the opening region has a second film structure, which extends from the first film structure and exists between the electro-optic element and the base plate, the second film structure is different from the first film structure so as to adjust the light passing through the opening region.

In this case, the second film structure includes one or more than one films, and at least one of a number, thicknesses, refractive indices and light absorption rates of the films of the second film structure differs from those of the first film structure for adjustment of transmissivity or a color temperature of the light passing through the opening region.

Moreover, the second film structure differs from the first film structure so that the refractive indices of the second film structure become closer to a refractive index of the base plate than those of the first film structure.

Moreover, the base plate is made of glass, and the first film structure includes a silicon nitride film having a refractive index different from that of the glass, and further the silicon nitride film is removed from the second film structure.

Moreover, the first film structure includes at least a gate insulation film existing between an active layer and a gate electrode of the thin film transistor, an interlayer insulation film existing between the thin film transistor and its wiring, and a protection film for covering the thin film transistor, and at least one of the gate insulation film, the interlayer insulation film and the protection film is removed from the second film structure.

In this case, the gate insulation film or the interlayer insulation film is removed from the second film structure in a process of forming a contact hole to the gate electrode or the wiring.

In an aspect of the present invention, the thin film transistor has a bottom gate structure in which the active layer is superposed above the gate electrode with the gate insulation film inserted between the active layer and the gate electrode, and the wiring is formed above the active layer with the interlayer insulation film inserted between the wiring and the active layer, and further at least the gate insulation film or the interlayer insulation film is removed from the second film structure.

In another aspect of the present invention, the thin film transistor has a top gate structure in which the gate electrode is superposed above the active layer with the gate insulation film inserted between the gate electrode and the active layer, and the wiring is formed above the gate electrode with the interlayer insulation film inserted between the wiring and the gate electrode, and further at least the gate insulation film or the interlayer insulation film is removed from the second film structure.

In addition, the active layer is made of polycrystalline silicon.

Moreover, the protection film is made of a transparent organic resin film, and the second film structure includes the organic resin film as it is.

According to the present invention, a multilayer film structure formed in a non-opening region is not extended to an opening region as it is, but the physical structures of films are varied between the non-opening region and the opening region. That is, a second film structure existing in the opening region varies from a first film structure existing in the non-opening region for adjusting light passing through a pixel electrode. For example, a film layer the refractive index of which is greatly different from that of a glass base plate among a plurality of transparent films included in the first film structure may be removed from the second film structure for suppressing unnecessary reflection owing to multiplex interference to improve the transmissivity and the color temperature of the opening region.

According to the present invention, there is also provided a display device manufacturing method for forming an opening region including an electro-optic element for emitting light through a transparent base plate and a non-opening region including a thin film transistor for driving the electro-optic element in each pixel disposed in a matrix on the base plate, in which the method comprises the steps of: forming a first film body including the thin film transistor in the non-opening region, and forming a second film body extending from the first film body and existing between the electro-optic element and the base plate, wherein the second film body is different from the first film body for adjusting the light passing through the opening region.

According to the present invention, there is also provided a liquid crystal display device including pixels disposed in a matrix on a transparent base plate, each pixel having an opening region, where an electro-optic element for emitting light through the base plate is formed, and a non-opening region, where a thin film transistor for driving the electro-optic element is formed, the electro-optic element being made by holding a liquid crystal material between transparent electrodes opposing to each other, the electro-optic element emitting light that has entered from one surface side of the base plate to another surface side of the base plate, wherein the non-opening region has a first film structure including the thin film transistor, and the opening region has a second film structure extending from the first film structure and existing between the electro-optic element and the base plate, the second film structure varying from the first film structure so as to adjust the light passing through the opening region.

According to the present invention, there is also provided a liquid crystal display device manufacturing method for forming an opening region including an electro-optic element for emitting light through a transparent base plate and a non-opening region including a thin film transistor for driving the electro-optic element in each pixel disposed in a matrix on the base plate, the electro-optic element being made by holding a liquid crystal material between transparent electrodes opposing to each other, the electro-optic element emitting light that has entered from one surface side of the base plate to another surface side of the base plate, in which the method comprises the steps of: forming a first film body including the thin film transistor in the non-opening region, and forming a second film body extending from the first film body and existing between the electro-optic element and the base plate, the second film body varying from the first film body so as to adjust the light passing through the opening region.

According to the present invention, there is also provided an organic electroluminescent display device including pixels disposed in a matrix on a transparent base plate, each pixel having an opening region, where an electro-optic element for emitting light through the base plate is formed, and a non-opening region, where a thin film transistor for driving the electro-optic element is formed, the electro-optic element being made by holding an organic electroluminescent material between electrodes opposing to each other, the electro-optic element emitting light that has been generated by itself from one surface side of the base plate to another surface side of the base plate, wherein the non-opening region has a first film structure including the thin film transistor, and the opening region has a second film structure extending from the first film structure and existing between the electro-optic element and the base plate, the second film structure varying from the first film structure so as to adjust the light passing through the opening region.

According to the present invention, there is also provided an organic electroluminescent display device manufacturing method for forming an opening region including an electro-optic element for emitting light through a transparent base plate and a non-opening region including a thin film transistor for driving the electro-optic element in each pixel disposed in a matrix on the base plate, the electro-optic element being made by holding an organic electroluminescent material between electrodes opposing to each other, the electro-optic element emitting light that has been generated by itself from one surface side of the base plate to another surface side of the base plate, in which the method comprises the steps of: forming a first film body including the thin film transistor in the non-opening region, and forming a second film body extending from the first film body and existing between the electro-optic element and the base plate, the second film body varying from the first film body for adjusting the light passing through the opening region.

According to the present invention, because layers having a refractive index different from that of a transparent base plate are removed from an opening region as many as possible, multiplex interference is decreased and the transmissivity of a panel is improved. And, because the multiplex interference can be suppressed, deviations in color on manufacturing can be decreased. In addition, unnecessary reflection on a panel can be decreased.

When the layers having a refractive index different from that of the base plate is removed from the opening region, there is not required a new manufacturing process.

In particular, in a case of forming a thin film transistor having an active layer made of low temperature polysilicon, because a silicon oxide film is used as a gate insulation film and a silicon nitride film is used as an undercoat film or a passivation film (protection film) for preventing the thin film transistor from contamination from a glass plate, a lamination structure having a refractive index different from that of the glass is easily produced. In that case, there can be obtained a remarkable effect in promoting the transmissivity and preventing from coloring by removing silicon nitride films from opening regions selectively according to the present invention.

BRIEF DESCRIPTION OF THE DRAWINGS

The above and other objects, features and advantages of the present invention will become more apparent from the following description of the presently preferred exemplary embodiments of the invention taken in conjunction with the accompanying drawings, in which:

FIG. 7 is a graph showing spectra of transmissivity of semiconductor thin films to be used in the present invention;

FIG. 20 is a graph showing a spectrum of transmissivity of a conventional display device.

DESCRIPTION OF THE PREFERRED EMBODIMENTS

Hereafter, attached drawings are referred while embodiments of the present invention are described in detail.

Figure 1:
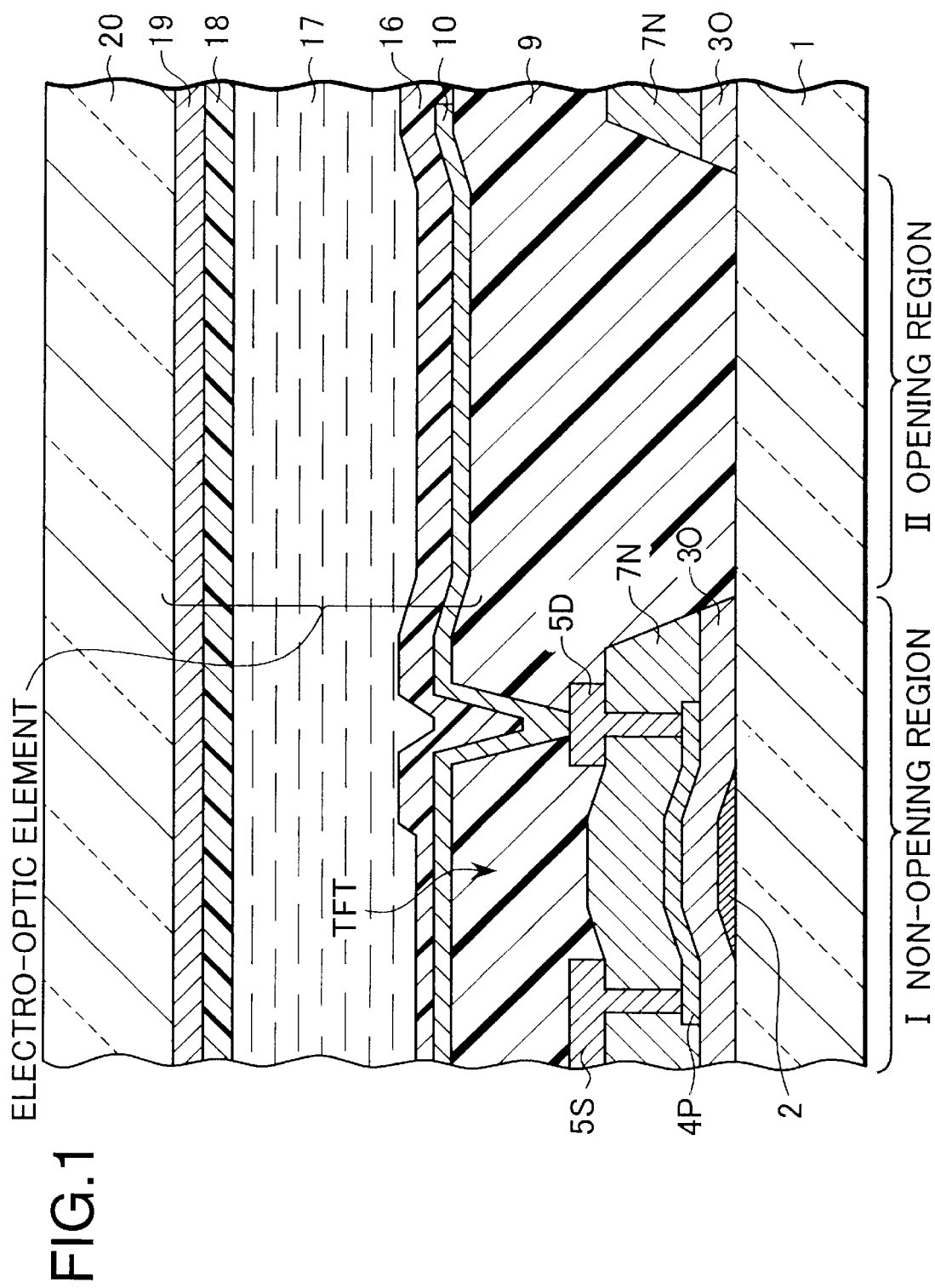
FIG. 1 is a partial sectional view showing a display device according to a first embodiment of the present invention.

FIG. 1 is an example of a schematic partial sectional view showing a display device of a first embodiment according to the present invention. FIG. 1 shows one pixel of the display device.

The display device of the present embodiment has pixels disposed in a matrix on a transparent base plate (substrate) 1 made of glass or the like. Each pixel is divided into an opening region II and a non-opening region I. An electro-optic element for emitting light through the base plate 1 is formed in the opening region II. The electro-optic element is constituted by holding liquid crystal 17 between transparent electrodes 10 and 19, for example, being made of ITO, opposing to each other. Such an electro-optic element is called as the so-called "liquid crystal cell". The liquid crystal cell functions as a light bulb that emits the light that has entered into the liquid crystal cell from a backlight source (not shown) situated on a backside of the glass base plate 1 to the front side of the base plate 1. Incidentally, the electrode 10 on one side is formed on the side of the glass base plate 1 as a pixel electrode, and the other electrode 19 is formed on the side of an opposing base plate (substrate) 20 as an opposing electrode. The surface of the pixel electrode 10 is covered with an orientation film 16 made of, for example, polyimide, and the surface of the opposing electrode 19 is also covered with an orientation film 18.

On the other hand, in the non-opening region I, a thin film transistor TFT for driving the aforesaid liquid crystal cell is formed. As shown in FIG. 1, the thin film transistor has a bottom gate structure. In the bottom gate structure, a polycrystalline semiconductor thin film 4P made of polysilicon or the like is formed above a gate electrode 2 made of a metal, for example, molybdenum (Mo) or the like with a gate insulation film 3O made of silicon oxide or the like and inserted between the polycrystalline semiconductor thin film 4P and the gate electrode 2. The polycrystalline semiconductor thin film 4P is covered with an interlayer insulation film 7N made of silicon nitride. On the interlayer insulation film 7N, a source electrode 5S and a drain electrode 5D, both being made of aluminum (Al), for example, are formed. These electrodes 5S and 5D are covered with a leveling film 9 made of an organic transparent resin film. The leveling film 9 is about 1–3 μm in thickness. The leveling film 9 performs a role of leveling the surface of the glass base plate 1 and a role of a protection film for the thin film transistor TFT. On the leveling film 9, as described above, the pixel electrode 10 is formed, and the pixel electrode 10 is electrically connected with the thin film transistor TFT through the drain electrode 5D.

The gate insulation film 3O, the interlayer insulation film 7N, the leveling film 9 and so forth, all being described above, form a first film structure by being superposed on each other. The first film structure includes the thin film transistor TFT in its non-opening region I. In other words, the first film structure is formed to a form that kernels the thin film transistor TFT from the upper and lower sides. On the other hand, in the opening region II adjoining the non-opening region I, a second film structure extending from the first film structure is disposed. In the embodiment shown in FIG. 1, the second film structure is composed of only the leveling film 9, and exists between the liquid crystal cell formed on the pixel electrode 10 and the glass base plate 1.

It is a feature of the present invention that the second film structure varies from the first film structure so as to adjust the light passing through the opening region II. In specific, the second film structure includes one or more than one films. At least one of the number, the thicknesses, the refractive indices and the light absorption rates of the films differ from those of the first film structure so as to adjust the transmissivity or the color temperature of the light passing through the opening region II.

In the present embodiment, the refractive index of the second film structure varies from that of the first film structure so as to be closer to the refractive index of the glass base plate 1 than that of the first film structure. In specific, the base plate 1 is made of the glass having a refractive index of, for example, 1.5, and the first film structure is made of a silicon nitride film having a refractive index within a range of 1.8 to 1.9 different from that of glass. On the contrary, the silicon nitride film is removed from the second film structure on the opening region side.

In the present embodiment, the first film structure on the non-opening region side includes at least the gate insulation film 3O existing between the polycrystalline semiconductor thin film 4P operating as an active layer of the thin film transistor TFT and the gate electrode 2, the interlayer insulation film 7N existing between the thin film transistor TFT and its wiring electrodes 5S and 5D, and the leveling film (protection film) 9 for covering the thin film transistor TFT. In this case, at least one of the gate insulation film 3O, the interlayer insulation film 7N and the protection film 9 is removed from the second film structure in the opening region side. In the present embodiment, the interlayer insulation film 7N made of silicon nitride is especially removed from the second film structure. In addition, the gate insulation film 3O made of silicon oxide is also removed from the second film structure. Consequently, only the leveling film 9 made of a transparent film is left in the opening region II.

These gate insulation film 3O and interlayer insulation film 7N are removed from the second film structure in a process of forming contact holes to the gate electrode 2 and the wiring electrodes 5S and 5D. Consequently, these removing processing can be realized only by altering a mask pattern, and the processes of exposure, development and etching can be performed in common for the non-opening region I and the opening region II.

In the present example, the thin film transistor TFT has a bottom gate structure in which the polycrystalline semiconductor thin film 4P as the active layer is superposed above the gate electrode 2 with the gate insulation film 3O inserted between the polycrystalline semiconductor thin film 4P and the gate electrode 2, and the wiring electrodes 5S and 5D are formed above the polycrystalline semiconductor thin film 4P being the active layer with the interlayer insulation film 7N inserted between the wiring electrodes 5S and 5D and the polycrystalline semiconductor thin film 4P. And, at least the gate insulation film 3O or the interlayer insulation film 7N is removed from the second film structure in the opening region II.

As described above, the present embodiment uses the polycrystalline semiconductor thin film 4P made of polycrystalline silicon as the active layer. Moreover, the leveling film (protection film) 9 is made of a transparent organic resin film, and the second film structure includes the organic resin film as it is. Incidentally, an inorganic glass film may be used as the leveling film 9 in place of the organic resin film according to circumstances. For example, tetra ethyl orthosilicate (TEOS) can be processed to the leveling film 9 by forming it to a film in conformity with a chemical vapor deposition (CVD) method. Moreover, the polycrystalline semiconductor thin film 4P can be made to a film at a low temperature of 600° C. or less by using a laser annealing method. High temperature polysilicon formed at 1,000° C. or more by solid phase epitaxy or the like may be used according to circumstances.

As described above, in the first embodiment, unnecessary films are removed from the opening region II, and only the leveling film 9 made of organic resin is formed directly on the glass base plate 1. When acrylate resin is used as the leveling film 9, the refractive index of the leveling film 9 becomes within a range of 1.4 to 1.6, which has almost no difference from that of the transparent glass base plate 1. Consequently, there occurs no unnecessary reflection due to the difference of refractive indices at the interface. As mentioned above, by removing layers having a refractive index different from that of the glass base plate 1 from the opening region II as much as possible, multiplex interference is decreased and the transmissivity of a panel is improved. Moreover, because the effects brought about by the interference are eliminated, the dispersion of colors caused in manufacturing processes can be decreased among units. In addition, reflection on a panel can be decreased. At that time, because the non-opening region I and the opening region II can be processed in common, any new process is not required. In particular, when low temperature polysilicon is used as the active layer, because a silicon oxide film is used as a gate insulation film and a silicon nitride film is used as a film protection from the contamination from glass or a passivation film in almost all the thin film transistor structures, lamination structures having different refractive indices are easily produced. In that case, the present invention has a great advantage.

Figure 2:
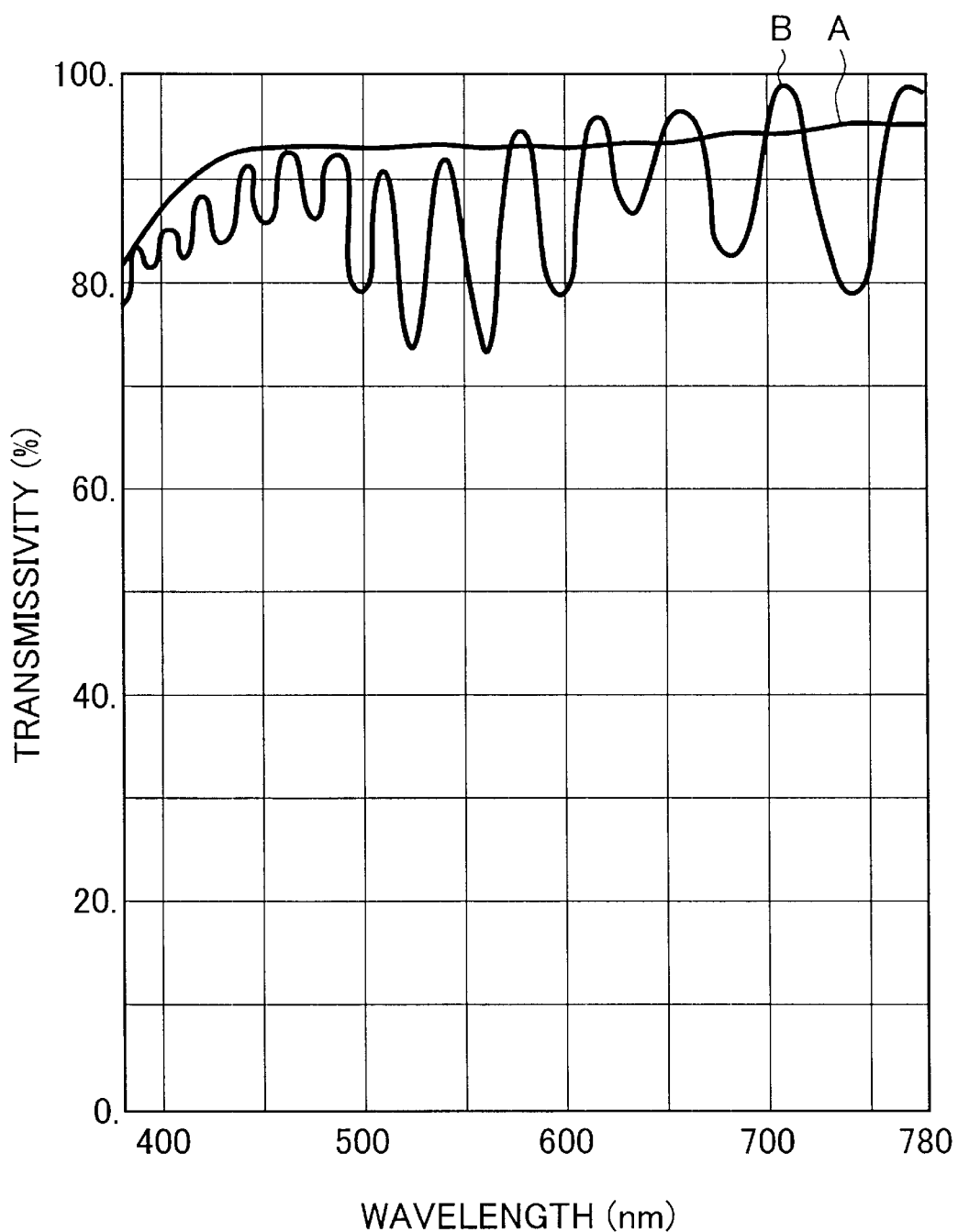
FIG. 2 is a graph showing spectra of transmissivity in opening regions of the embodiment shown in FIG. 1 and prior art.

FIG. 2 is a graph showing spectra of transmissivity in the opening regions II of the embodiment shown in FIG. 1 and a conventional display device. In the graph, the curve "A" indicates the spectrum of transmissivity of the present embodiment, and the curve "B" indicates the spectrum of transmissivity of a conventional display device. The conventional display device has the same second film structure as the first film structure. That is, the second film structure of the conventional display device includes all components included in the first film structure such as a gate insulation film, an interlayer insulation film and the like. As apparent from the graph, by removing unnecessary films from the opening region II, there occurs no interference phenomena, and the spectrum becomes flat over all visible wavelength range. In addition, the whole transmissivity is improved by 10% in comparison with the conventional one. That is, unnecessary reflection is also decreased.

Figure 3:
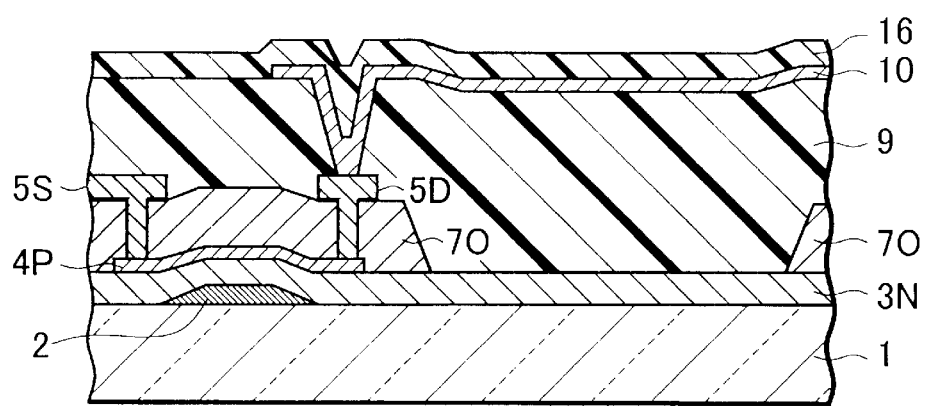
FIG. 3 is a schematic partial sectional view showing a second embodiment of the present invention.

FIG. 3 is an example of a schematic partial sectional view showing a display device of a second embodiment according to the present invention. Components corresponding to those of the first embodiment shown in FIG. 1 are designated by reference numerals corresponding to those of the first embodiment for facilitating understanding.

In the second embodiment, a gate insulation film 3N is made of silicon nitride. An interlayer insulation film 7O is made of silicon oxide. In the opening region, the interlayer insulation film 7O is removed. On the other hand, the gate insulation film 3N is left as it is.

The spectrum on the short wavelength side (blue color) of the spectrum of transmissivity shown in FIG. 2 falls a little. In the present embodiment, the silicon nitride layer is intentionally left in the opening region for raising the fall of the transmissivity on the short wavelength side. For raising the spectrum of the blue color on the short wavelength side by utilizing the multiplex reflection of silicon nitride, the film thickness of the silicon nitride layer may be set as about 140 nm. That is, by forming the gate insulation film 3N in the bottom gate structure in thickness of 140 nm in advance, and then by leaving the gate insulation film 3N in the opening region as it is, the spectrum of transmissivity can be raised on the short wavelength side.

Figure 4:
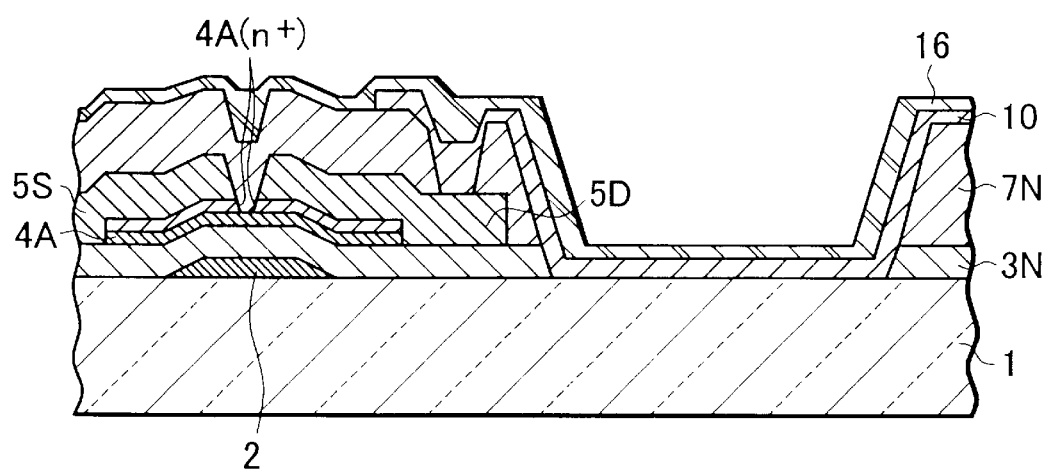
FIG. 4 is a partial sectional view showing a third embodiment of the present invention.
Figure 13:
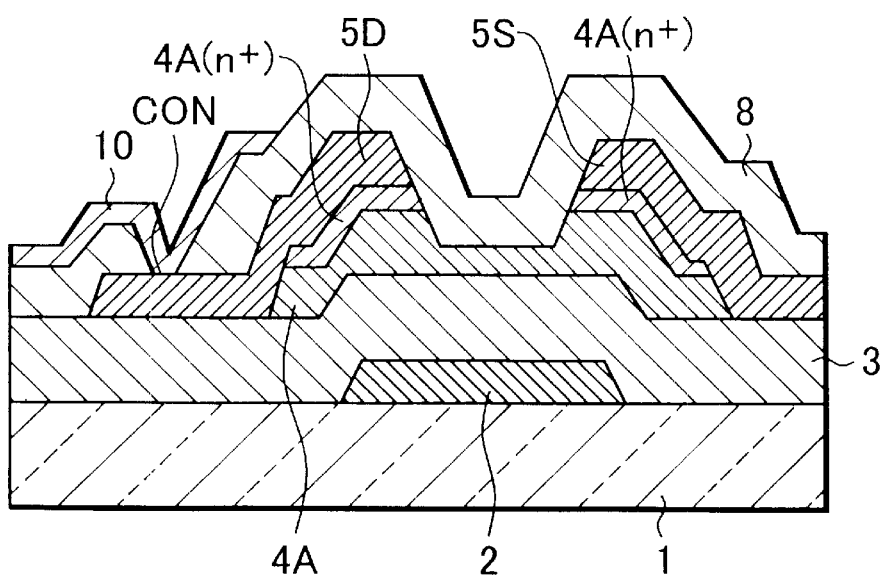
FIG. 13 is a partial sectional view showing a conventional display device.
Figure 14:
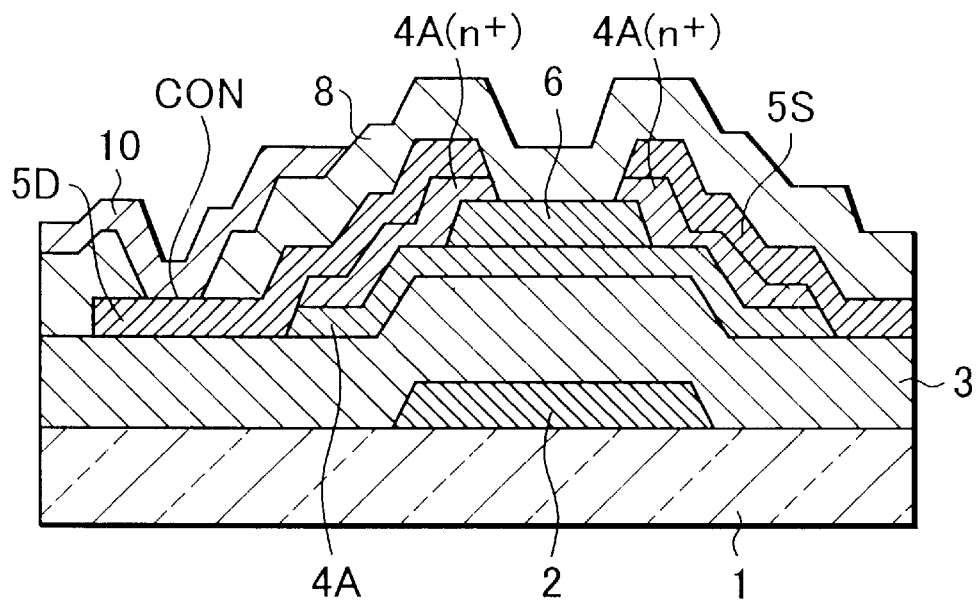
FIG. 14 is a partial sectional view showing another conventional display device.
Figure 15:
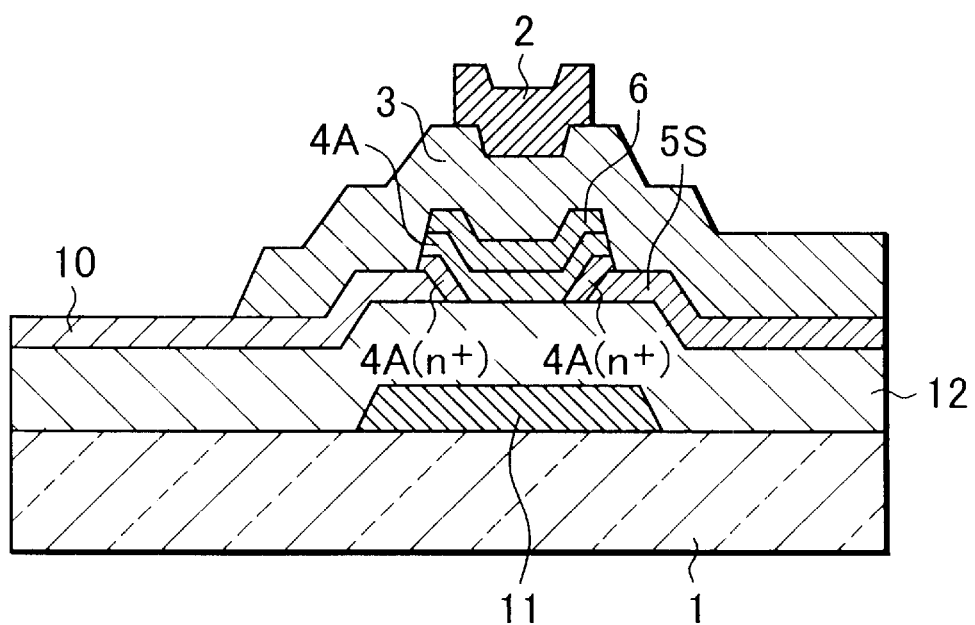
FIG. 15 is a partial sectional view showing a further example of a conventional display device.
Figure 16:
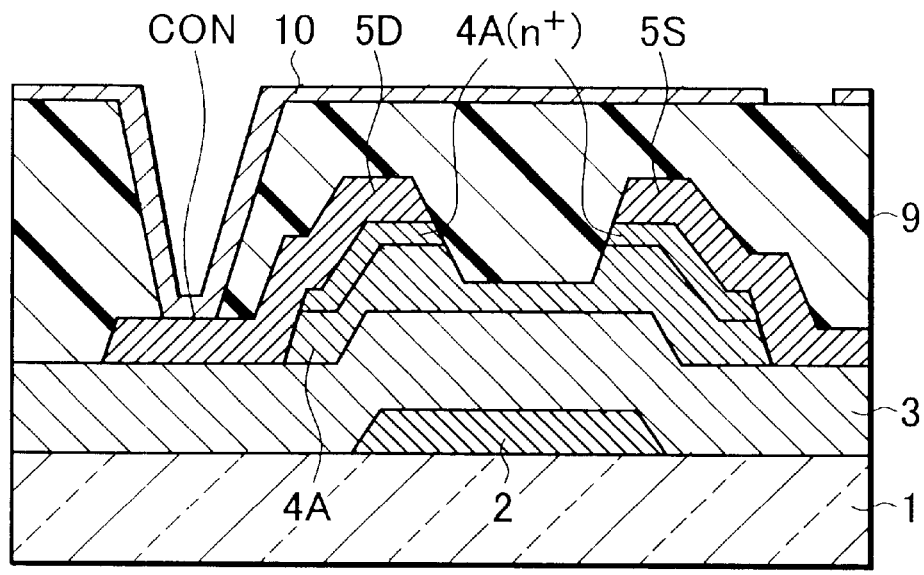
FIG. 16 is a partial sectional view showing a further example of a conventional display device.
Figure 17:
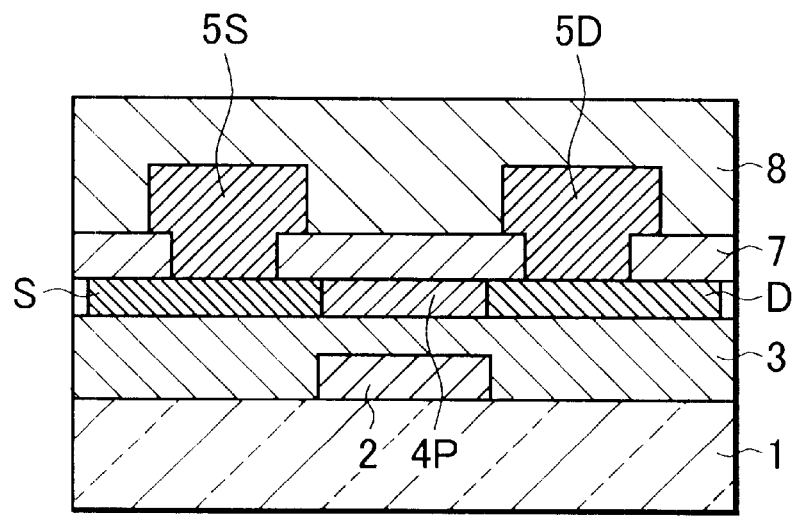
FIG. 17 is a partial sectional view showing a further example of a conventional display device.

FIG. 4 is an example of a schematic partial sectional view of a display device of a third embodiment according to the present invention. In the embodiment, there is employed a bottom gate structure in which an amolphous semiconductor thin film 4A made of amorphous silicon or the like as an active layer of a thin film transistor. In the present embodiment, a channel etch type thin film transistor structure is employed. However, the embodiment is not restricted to the structure, but the embodiment may also be applied to a channel protection type thin film transistor structure. Incidentally, in the embodiment, a gate insulation film 3N and an interlayer insulation film 7N are removed from the opening region, and a pixel electrode 10 contacts with a glass base plate 1 directly. The thin film transistor structure shown in FIG. 4 is basically the same as that shown in FIG. 13.

Figure 5:
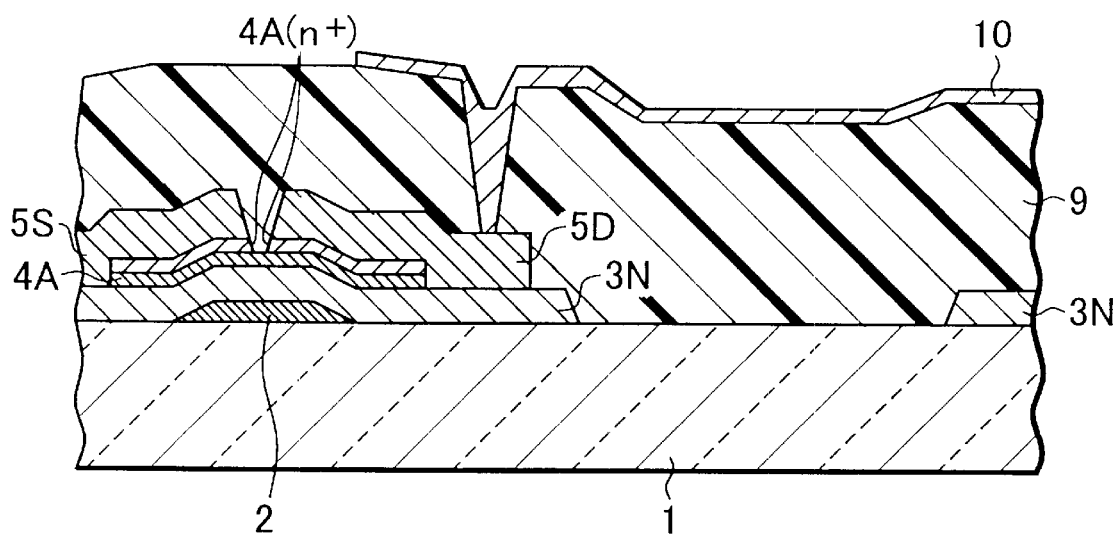
FIG. 5 is a partial sectional view showing a fourth embodiment of the present invention.

FIG. 5 is an example of a schematic partial sectional view showing a display device of a fourth embodiment according to the present invention. The fourth embodiment is basically the same as the third embodiment shown in FIG. 4. The fourth embodiment differs from the third embodiment in that a leveling film 9 made of an organic resin film exists in the opening region. In addition, an orientation film 16 is also omitted.

Figure 6:
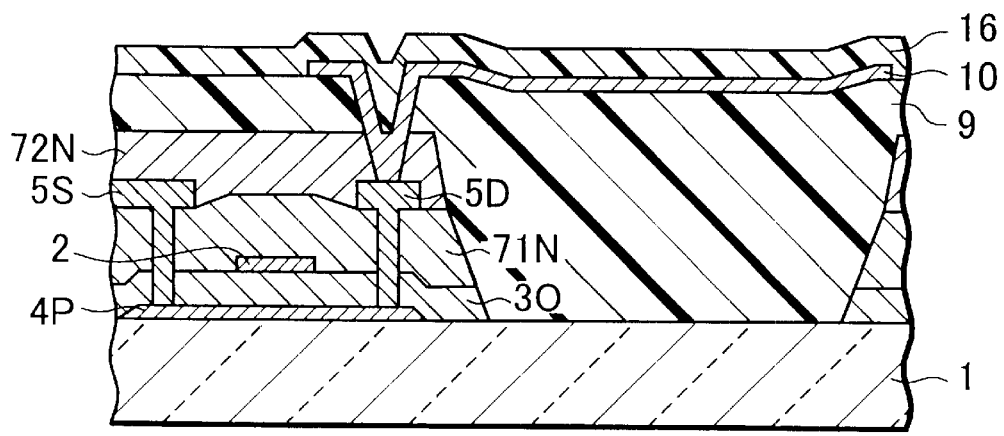
FIG. 6 is a partial sectional view showing a fifth embodiment of the present invention.
Figure 18:
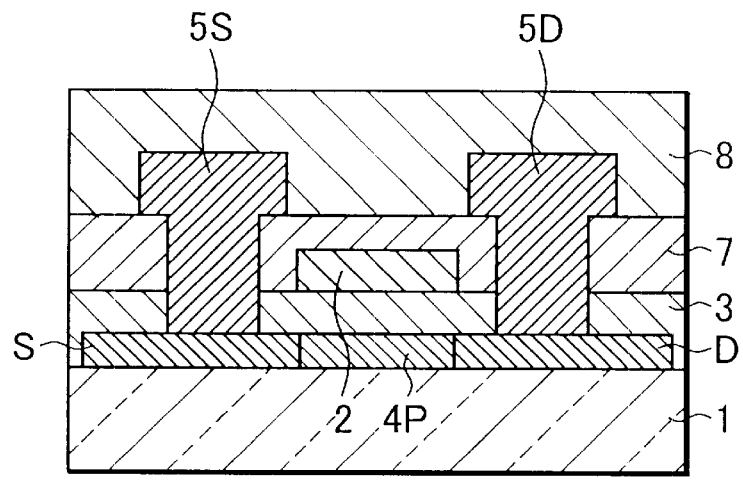
FIG. 18 is a partial sectional view showing a further example of a conventional display device.
Figure 19:
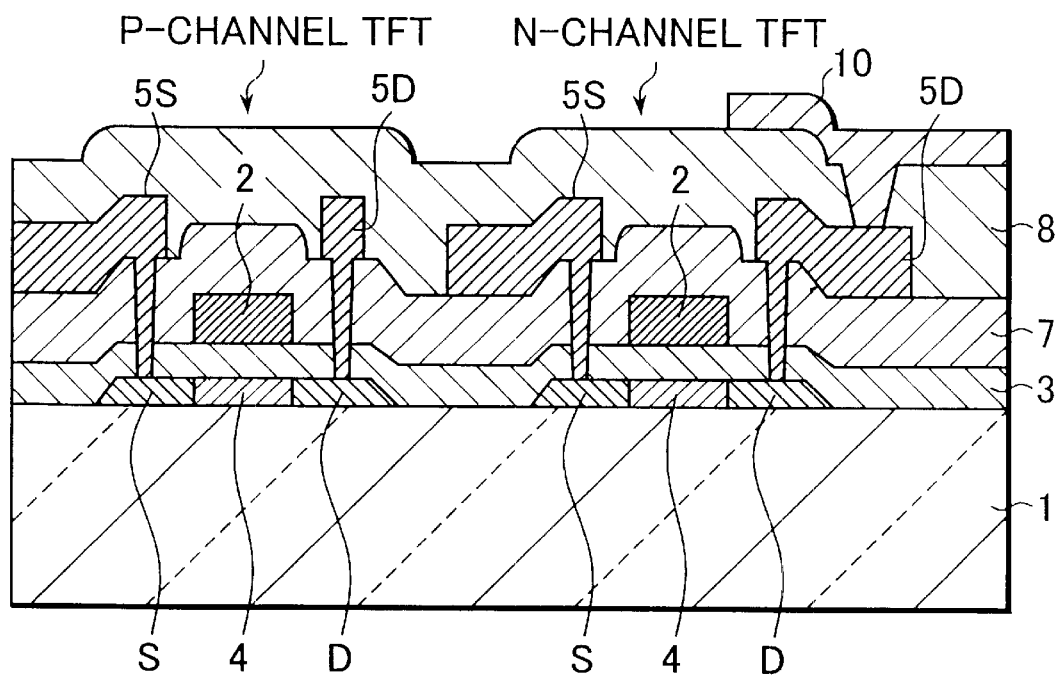
FIG. 19 is a partial sectional view showing a further example of a conventional display device.

FIG. 6 is a schematic partial sectional view showing a display device of a fifth embodiment according to the present invention. The thin film transistor has a top gate structure, and it has basically the same structure as the conventional one shown in FIG. 18. A gate insulation film 3O made of silicon oxide, a first interlayer insulation film 71N made of silicon nitride, and a second interlayer insulation film 72N similarly made of the silicon nitride are removed from the opening region. On the other hand, a leveling film 9 made of transparent resin is left in the opening region as it is. In this embodiment, too, because films having a refractive index greatly different from that of a glass base plate 1 are removed from the opening region where the control of transmission light is substantially performed, the influence of multiplex interference becomes small.

By the way, polysilicon and amorphous silicon, both being used as an active layer, are tinted, but almost all the light can penetrate them. It is considerable to control the optical characteristics in the opening region by utilizing the color of the active layer positively. In this case, a semiconductor thin film being used as an active layer is left in the opening region. For reference, the spectra of transmissivity of the polysilicon film and the amorphous silicon film are shown in FIG. 7. Their film thicknesses are 40 nm, respectively. In FIG. 7, the spectrum of the polysilicon is indicated by a reference numeral "4P", and the spectrum of the amorphous silicon is indicated by a reference numeral "4A". Because there appears absorption on a short wavelength side in both of them, the light passed through these films takes a hue tinted with yellow color.

Next, FIGS. 8A to 8H are referred while an example of a method for manufacturing a display device according to the present invention is described in specific. The present example is to form integrally thin film transistors using polysilicon as their active layers in a bottom gate structure.

Figure 8A:
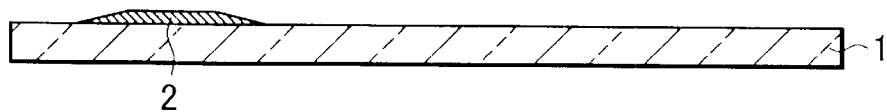
FIG. 8A to FIG. 8H are partial sectional views showing each step of a method for manufacturing a display device according to the present invention.

At first, as shown in FIG. 8A, a gate electrode 2 is formed on a transparent glass base plate 1 to be a thickness of, for example, 200 nm by using a metal of, for example, Cr, Al, Mo, Ta, or the like.

Figure 8B:
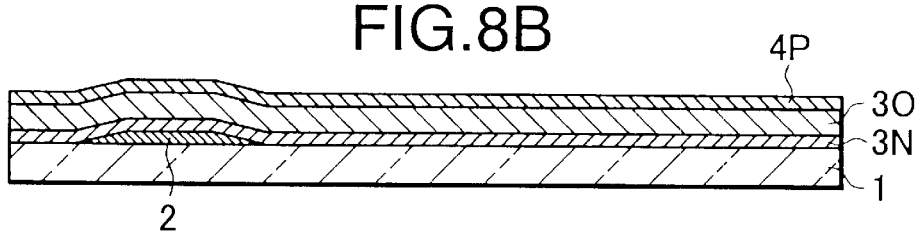

At the next process shown in FIG. 8B, for example, a silicon nitride film and a silicon oxide film are laminated on the gate electrode 2 in the order to be thicknesses of 50 nm and 150 nm, respectively, as gate insulation films 3N and 3O, respectively, and then an amorphous silicon film is continuously formed to be a thickness of 50 nm. After that the amorphous silicon film is made to be crystallized by means of thermal annealing with an infrared lamp or laser annealing to form a semiconductor thin film 4P made of polycrystalline silicon. Or, the polysilicon film may be directly formed by means of another thermal CVD method, or the like.

Figure 8C:
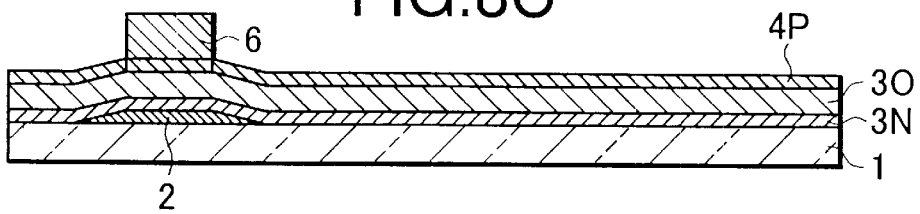

Then, at the next process shown in FIG. 8C, a silicon oxide film is formed, and after that the silicon oxide film is patterned so as to cover a channel part of the semiconductor thin film 4P above the gate electrode 2 to be a channel protection film 6. By using the channel protection film 6 as a mask, ions of phosphorus or arsenic are implanted at a low concentration for forming an LDD region. In this case, the channel protection film 6 for masking is not necessarily formed with the silicon oxide, but the channel protection film 6 may be formed with a resist or the like.

Figure 8D:
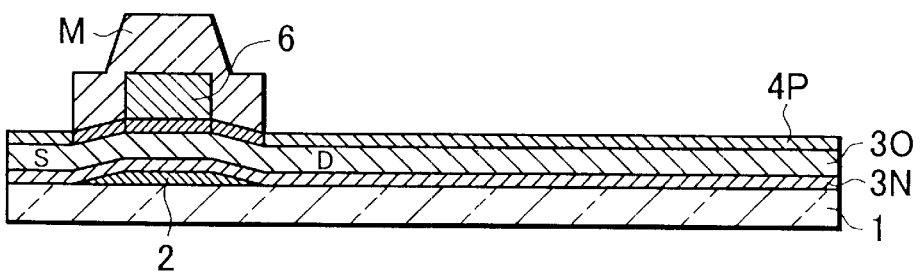

At the next process shown in FIG. 8D, a mask M is formed with resist or the like for forming a source region S and a drain region D, and ions of phosphorus or arsenic are implanted into the mask M at a high concentration. After that, thermal annealing or laser annealing is performed for activating impurities implanted appropriately.

Figure 8E:
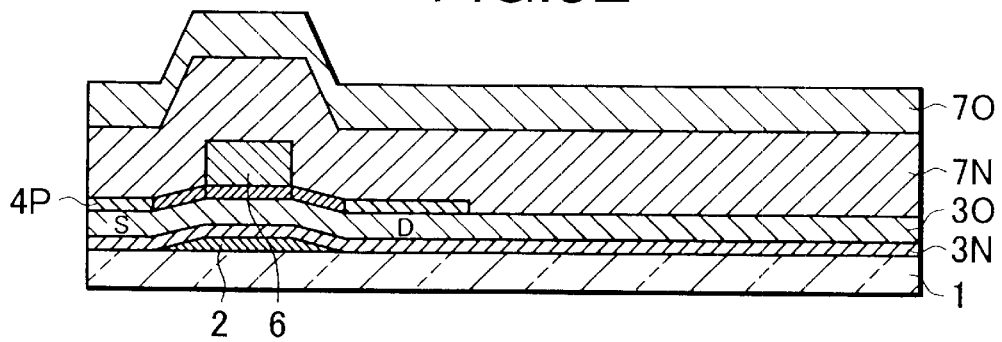

At the next process shown in FIG. 8E, the semiconductor thin film 4P is patterned except for a part to be formed as a thin film transistor element. After that, a silicon nitride film in a thickness of 300 nm and a silicon oxide film in a thickness of 200 nm are continuously formed to be interlayer insulation films 7N and 7O, respectively.

Figure 8F:
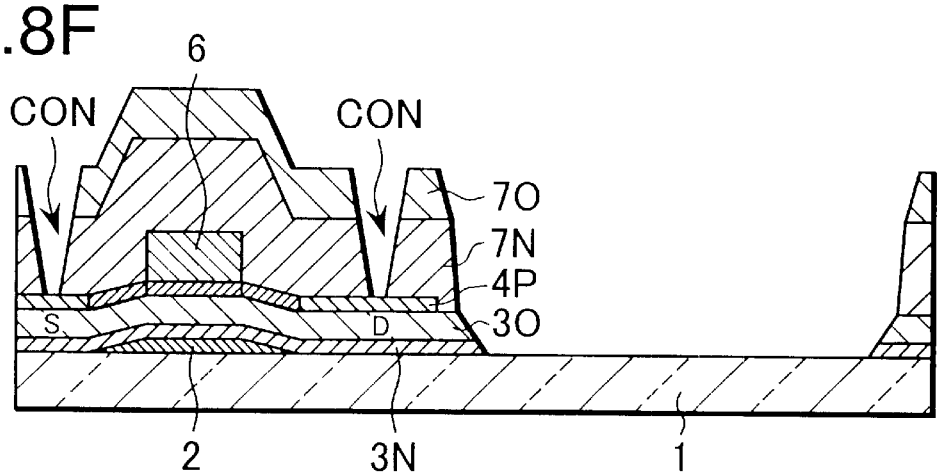

At the next process shown in FIG. 8F, interlayer insulation films 7N and 7O and the gate insulation films 3N and 3O are etched to be removed at a part of contact holes CON on the polycrystalline semiconductor thin film 4P, a part of a contact hole (not shown) on the gate electrode 2 and a part to be the opening region.

Figure 8G:
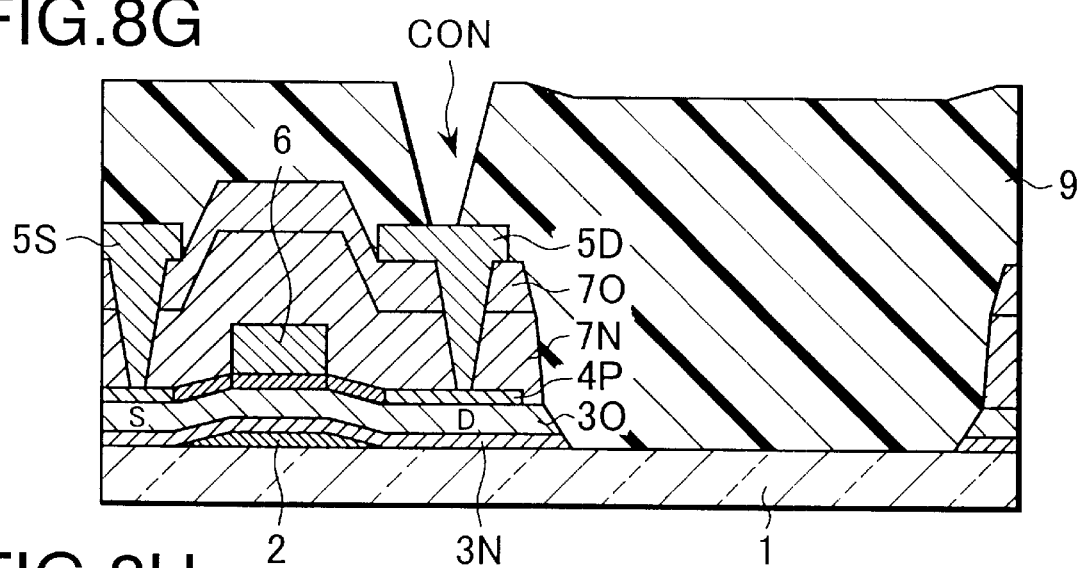

At the next process shown in FIG. 8G, a source electrode 5S and a drain electrode 5D are formed with aluminum or the like. After that, a leveling film 9 is formed with organic resin in regions except for a part to be the contact holes CON, a part for forming a pad (not shown) and the like in a thickness of 2 μm.

Figure 8H:
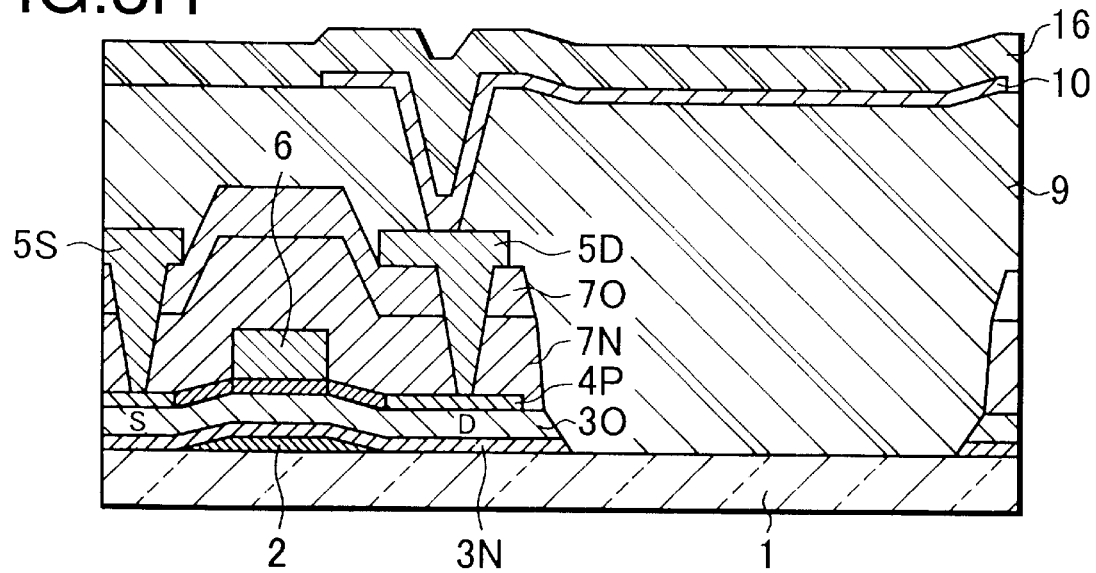

At the last process shown in FIG. 8H, a pixel electrode 10 made of ITO or the like is formed so as to cover the opening region where the organic leveling film 9 has been embedded. After that, an orientation film 16 made of polyimide is formed for orientating liquid crystal, and an orientation process is performed.

The base plate made by the aforesaid method is affixed with an opposing base plate on which a color filter, an opposing electrode and an orientation film are formed in a usual manner. After that, liquid crystal is injected between both the base plates to form a panel.

In the method, there is required no special process for eliminating a silicon nitride film and the like existing the opening region and having a different refractive index. The silicon nitride film and the like in the opening region are processed simultaneously at the process for forming contact holes with the gate electrode and the semiconductor thin film. However, the elimination method of the silicon nitride film and the like of the present invention is not limited to the aforesaid method, but another masking process may be used for controlling the etching amount of the laminated films in the opening region separately from the masking process for the non-opening region. Moreover, in the present method, all the layers of the interlayer insulation film and the gate insulation film are etched to be removed. However, it need scarcely be said that, if only a silicon oxide film is used as a gate insulation film, it is not necessary to eliminate the gate insulation film. Moreover, because short period interference shown in FIG. 20 is produced in a silicon nitride film used as an interlayer insulation film, it is possible to decrease the interference only by removing only the silicon nitride film.

FIGS. 9A to 9H are partial sectional views showing each step of another method for manufacturing a display device according to the present invention. Because the method shown in FIGS. 9A to 9H are basically the same as the method shown in FIGS. 8A to 8H, only the points different in each other will be described in the following.

Figure 9A:
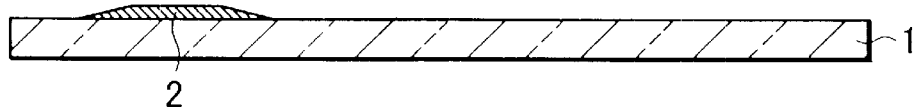
FIG. 9A to FIG. 9H are partial sectional views showing each step of another method for manufacturing a display device according to the present invention.
Figure 9B:
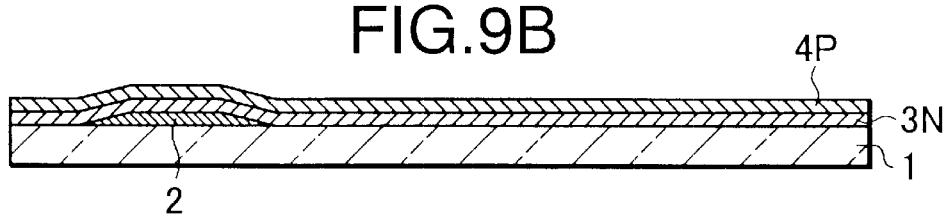
Figure 9C:
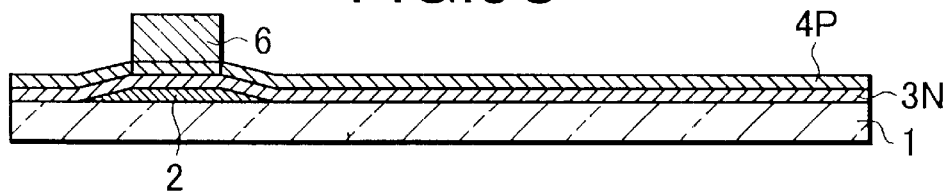
Figure 9D:
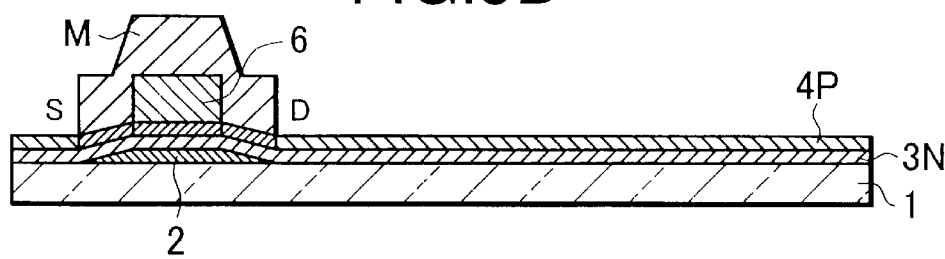

At first, at a process shown in FIG. 9B, only a single layer of a gate insulation film 3N made of silicon nitride is formed. The thickness of the film is about 140 nm.

Figure 9E:
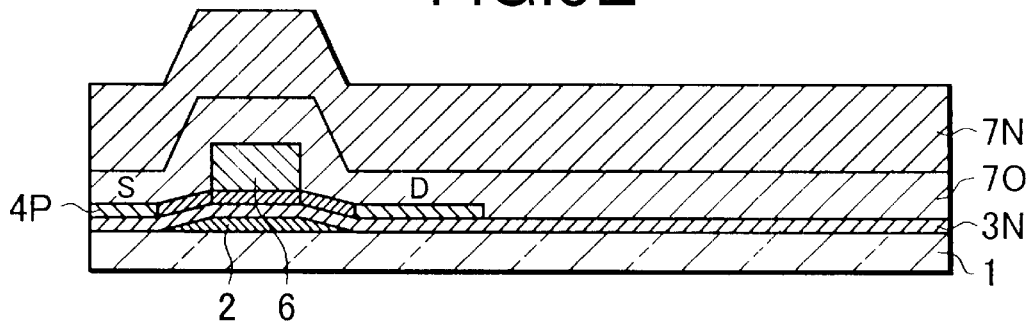

Moreover, at a process shown in FIG. 9E, silicon oxide is accumulated to be a thickness of 200 nm to be an interlayer insulation film 7O, and silicon nitride is accumulated on the interlayer insulation film 7O to be a thickness of 300 nm to be an interlayer insulation film 7N.

Figure 9F:
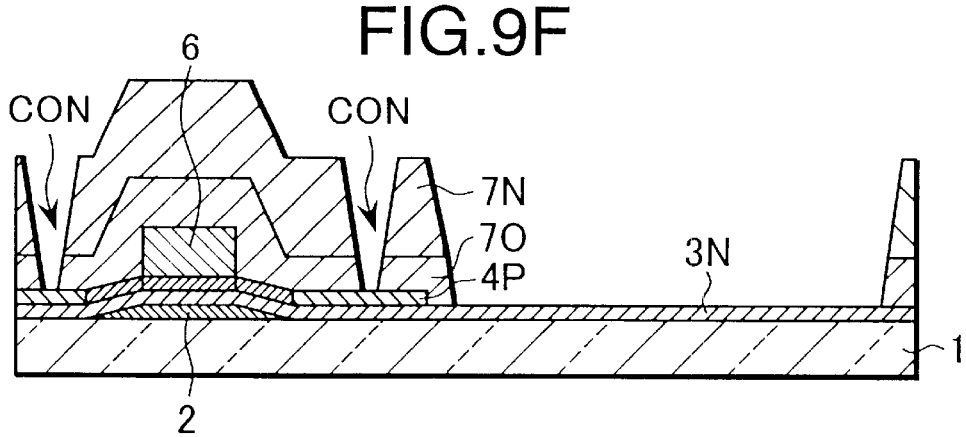
Figure 9G:
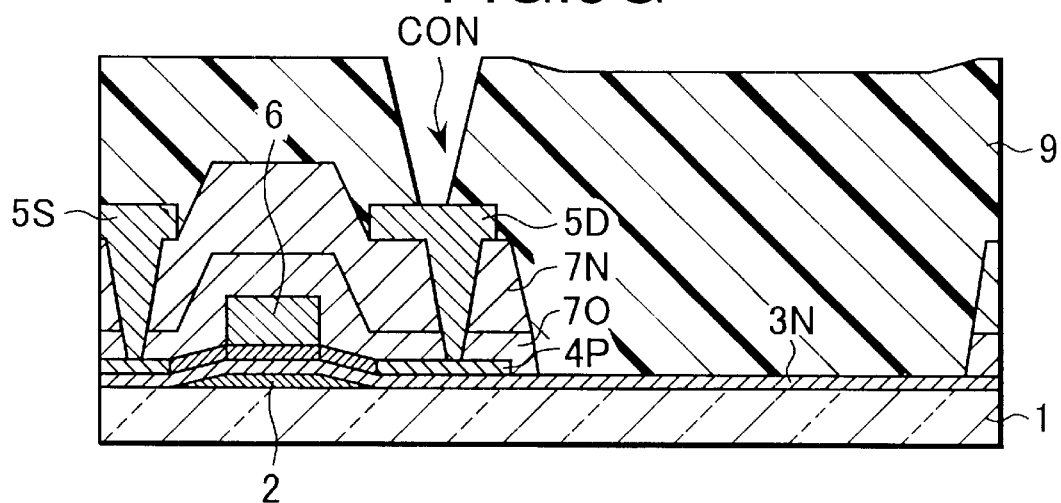
Figure 9H:
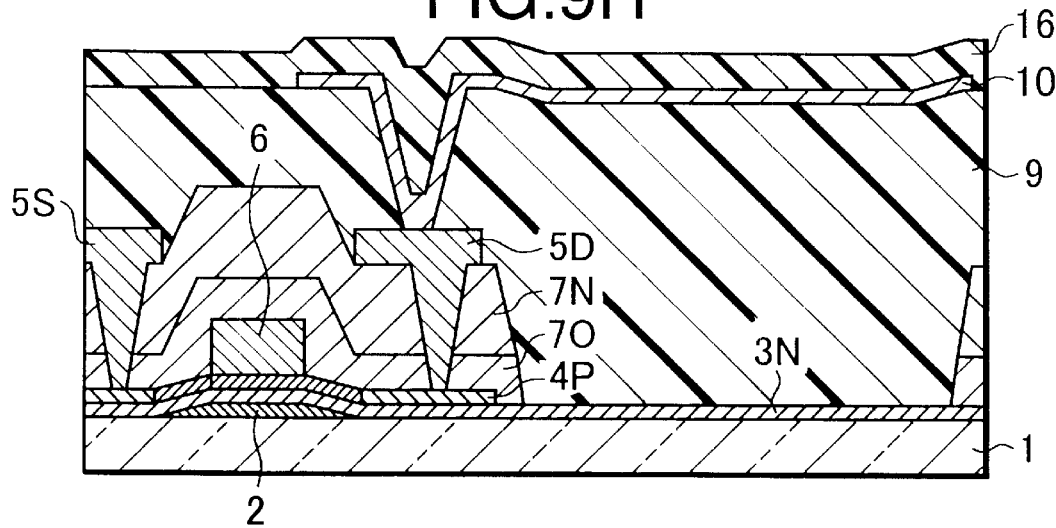

After that, at a process shown in FIG. 9F, a gate insulation film 3N having a thickness of 140 nm and being made of silicon nitride is left in the opening region. On the other hand, the interlayer insulation films 7O and 7N are removed from the opening region. At this time, an interlayer insulation film 7O made of silicon oxide is laid between the gate insulation film 3N made of silicon nitride and the interlayer insulation film 7N similarly made of the silicon nitride. That is, the gate insulation film 3N made of silicon nitride and the interlayer insulation film 7O made of silicon oxide are in a state of contacting with each other. It is possible that only the gate insulation film 3N made of silicon nitride is left in the opening region by utilizing the difference of etching rates of both of the silicon nitride and the silicon oxide.

After that, similarly to the previous example, the opening region and a non-opening region are covered with a leveling film 9 made of transparent organic resin.

In the present example, because a silicon nitride film having a thickness of 140 nm is left in the opening region, a spectrum of transmissivity in a blue region on the short wavelength side can intentionally be raised.

FIGS. 10A to 10H are process drawings showing each step of a further other method for manufacturing a display device according to the present invention. In the example, a thin film transistor having a top gate structure is formed.

Figure 10A:
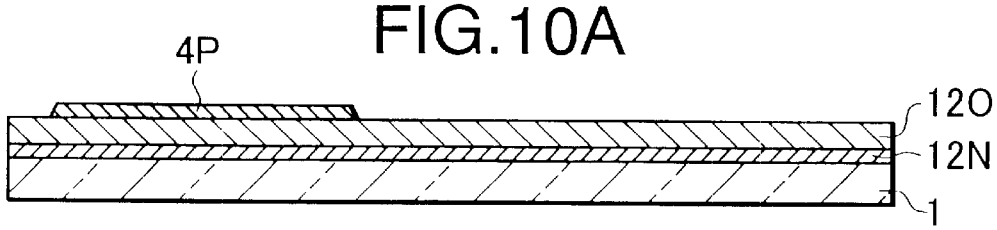
FIG. 10A to FIG. 10H are partial sectional views showing each step of a further other method for manufacturing a display device according to the present invention.

At first, at a process shown in FIG. 10A, on a transparent glass base plate 1, for example, a silicon nitride film having a thickness of 100 nm and a silicon oxide film having a thickness of 300 nm are laminated to be undercoat films 12N and 12O, respectively, for preventing the diffusing of impurities from the glass base plate 1. After that, a film of amorphous silicon is continuously formed to be a thickness of 50 nm. The amorphous silicon film is crystallized by means of thermal annealing using an infrared lamp or laser annealing to be a semiconductor thin film 4P made of polysilicon. Incidentally, the polycrystalline semiconductor thin film 4P may be formed to be a film by means of other thermal CVD method or the like directly. After that, the polycrystalline semiconductor thin film 4P is patterned in conformity with a shape of a device region of a thin film transistor.

Figure 10B:
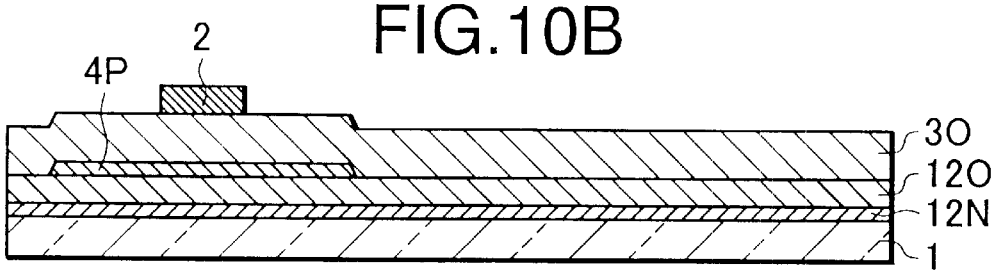

At the next process shown in FIG. 10B, for example, a silicon oxide film having a thickness of 150 nm is formed on the semiconductor thin film 4P as a gate insulation film 3O. After that, for example, tungsten, molybdenum, aluminium or the like is laminated to be a thickness of 300 nm as a gate electrode 2. After that, the gate electrode 2 is patterned to be a prescribed shape.

Figure 10C:
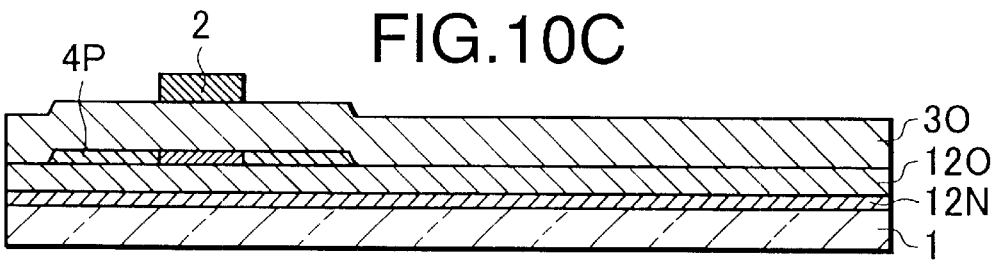

At the next process shown in FIG. 10C, ions of phosphorus, arsenic or the like are implanted to be a relatively low concentration by the use of the gate electrode 2 as a mask for forming an LDD region.

Figure 10D:
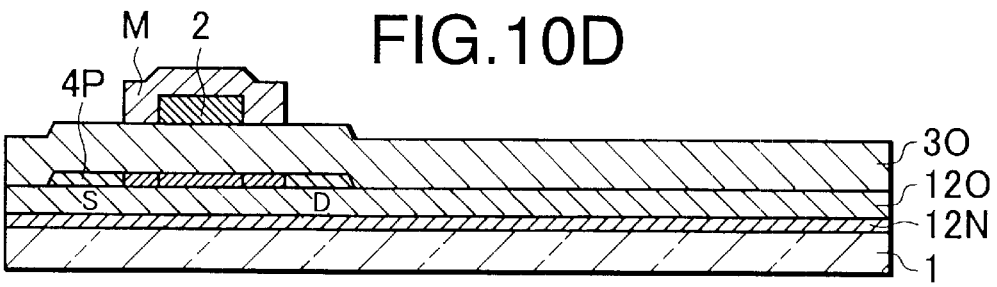

At the next process shown in FIG. 10D, a mask M is formed with resist or the like for forming a source region S and a drain region D, and ions of phosphorus or arsenic is implanted into the mask M to be a high concentration. After that, thermal annealing or laser annealing is performed for activating implanted impurities appropriately.

Figure 10E:
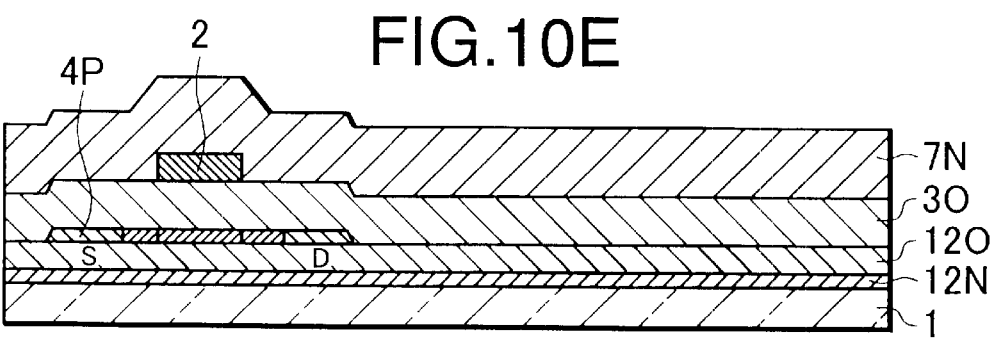

At the next process shown in FIG. 10E, a silicon nitride film is formed to be a thickness of 400 nm as an interlayer insulation film 7N. In this case, as the interlayer insulation film 7N, a silicon oxide film may be used. Moreover, the interlayer insulation film 7N may be formed as a laminated structure of the silicon nitride film and the silicon oxide film.

Figure 10F:
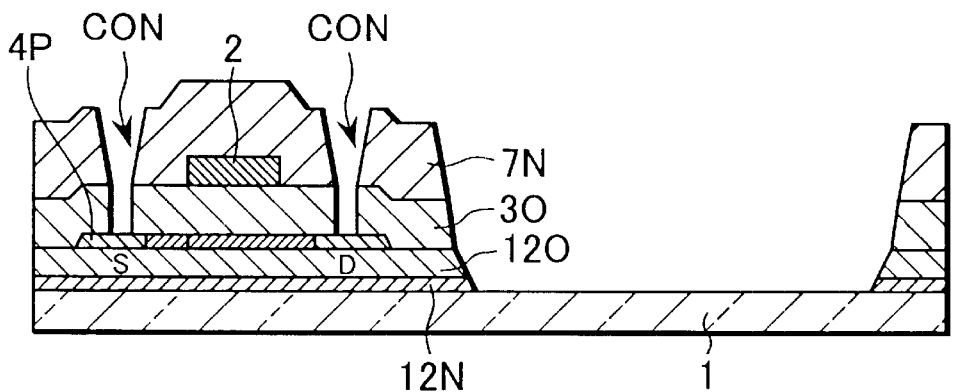

At the next process shown in FIG. 10F, the undercoat films 12N and 12O, the gate insulation film 3O and the interlayer insulation film 7N are etched to be removed at a forming part of contact holes CON on the polycrystalline semiconductor thin film 4P, a forming part of a contact hole (not shown) on the gate electrode 2 and a part to be formed to be the opening region.

Figure 10G:
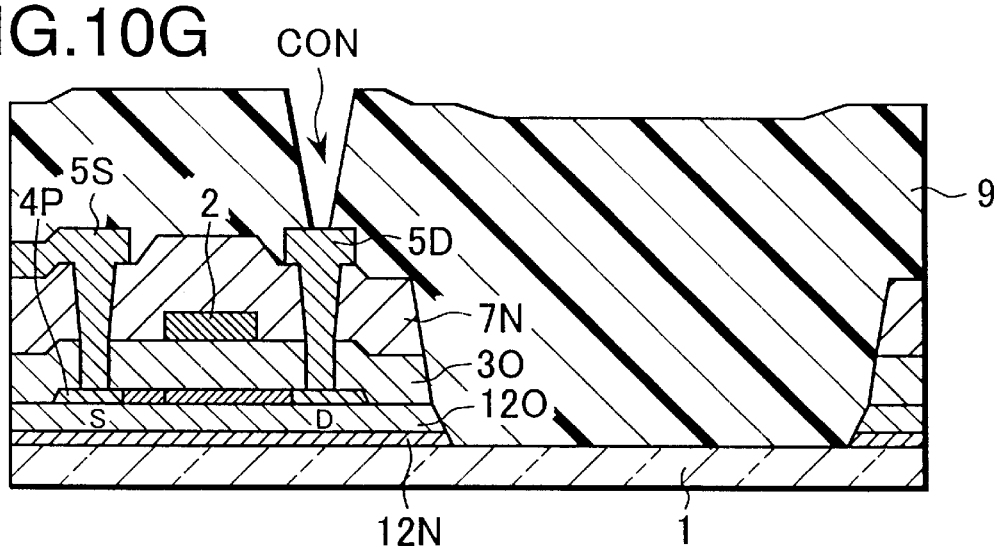

At the next process shown in FIG. 10G, a leveling film 9 made of organic resin is formed over all regions except for a part where the contact holes CON with a pixel electrode is formed, a part for forming a pad (not shown) and the like.

Figure 10H:
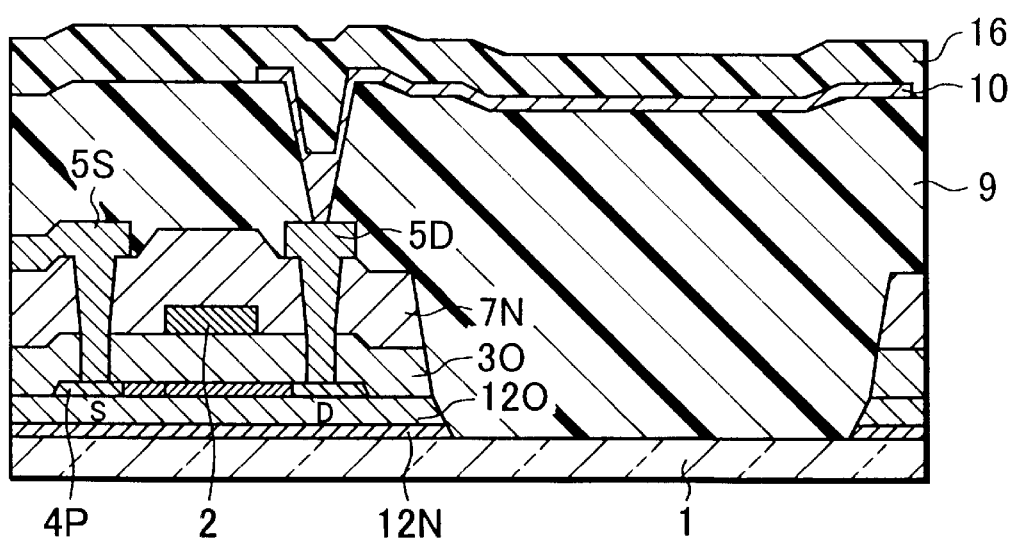

At the last process shown in FIG. 10H, a pixel electrode 10 made of ITO or the like is formed so as to cover the opening region where the organic leveling film 9 has been embedded. After that, an orientation film 16 is formed for orientating liquid crystal, and an orientation process is performed.

The base plate 1 of a thin film transistor made by the aforesaid method is affixed with an opposing base plate on which a color filter, an opposing electrode and an orientation film are formed. After that, liquid crystal is injected between both the base plates to complete a liquid crystal panel.

Figure 11:
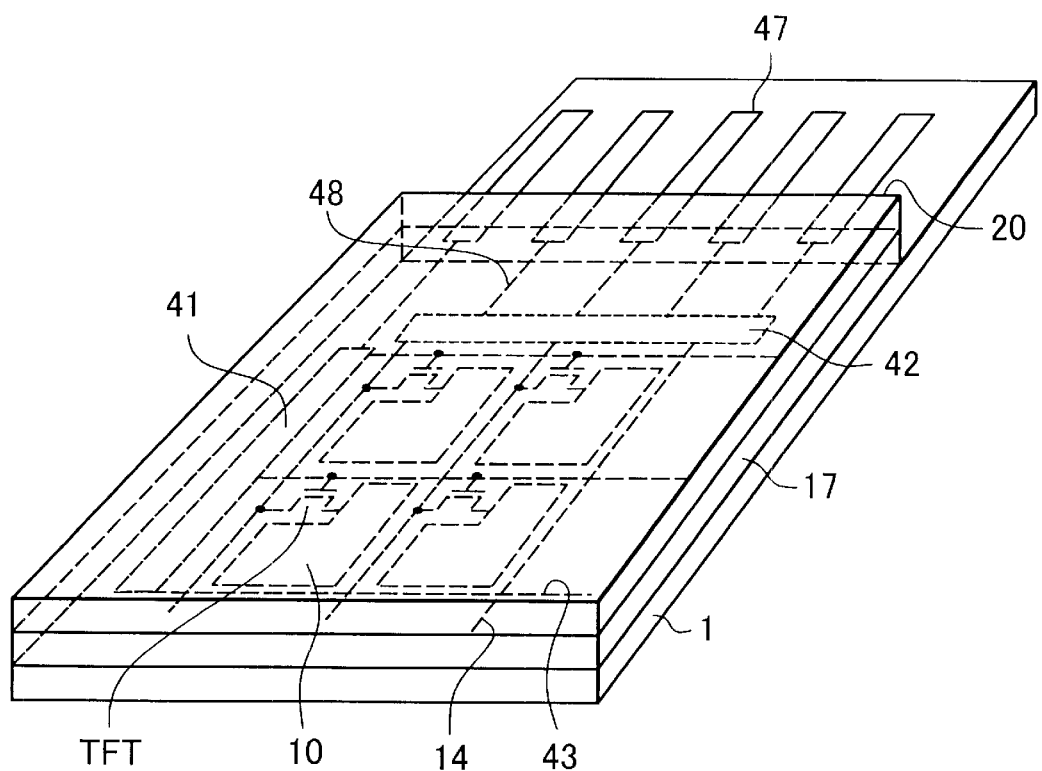
FIG. 11 is a perspective view showing the whole configuration of an active matrix type liquid crystal display device according to the present invention.

FIG. 11 is a schematic perspective view showing the whole configuration of a display device according to the present invention, and shows an example of an active matrix type liquid crystal display device.

The display device has a structure holding an electro-optic material such as liquid crystal 17 between a driving base plate 1 and an opposing base plate 20.

On the driving base plate 1, a pixel array part and a peripheral circuit part are integrally formed.

The peripheral circuit part is divided into a vertical scanning circuit 41 and a horizontal scanning circuit 42. Moreover, on the top end side of the driving base plate 1, terminal electrodes 47 for external connecting are also formed. Each terminal electrode 47 is connected with the vertical scanning circuit 41 and the horizontal scanning circuit 42 through a wiring 48.

In the pixel array part, gate wirings 43 and signal wirings 44, both being crossed to each other, are formed. The gate wirings 43 are connected with the vertical scanning circuit 41, and the signal wirings 44 are connected with the horizontal scanning circuit 42. At crossing portions of both the wirings 43 and 44, pixel electrodes 10 and thin film transistors TFT for driving the pixel electrodes 10 according to the present invention are formed.

On the other hand, in the inner surface of the opposing base plate 20, an opposing electrode of ITO, not shown, is formed.

Figure 12:
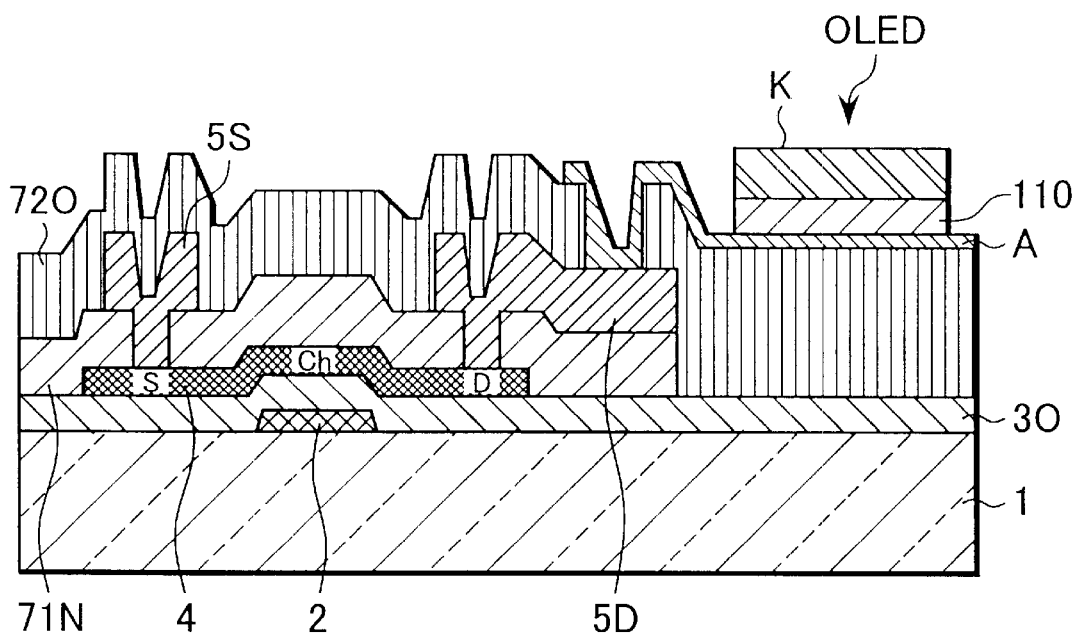
FIG. 12 is a partial sectional view showing an example of an organic electroluminescent display device according to the present invention.

FIG. 12 is a schematic partial sectional view showing a display device of a further other embodiment according to the present invention, and shows only one pixel. The present embodiment uses an organic electroluminescent element OLED as an electro-optic element in place of a liquid crystal cell. The organic electroluminescent element OLED is made by superposing an anode "A", an organic layer 110, both being made of a transparent conductive film such as ITO, and a metal cathode "K" on each other in the order. The anode "A" is separated by every pixel, and is transparent basically. The cathode "K" is commonly connected among respective pixels, and has a characteristic reflecting light basically.

When a forward voltage (about 10V) is applied between the anode "A" and the cathode "K" of the organic electroluminescent element OLED having such a structure, carriers such as electrons and holes are injected into the organic electroluminescent element OLED, and light emission is observed. The light emission of the organic electroluminescent element OLED is considered as the light emission by excitons formed with holes injected from the anode "A" and electrons injected from the cathode "K". The organic electroluminescent element OLED emits the light that is produced by itself from the front surface side of a base plate 1 made of glass or the like to the back surface of the base plate 1.

On the other hand, a thin film transistor for driving the organic electroluminescent element OLED is composed of a gate electrode 2, a gate insulation film 3O superposed on the gate electrode 2, and a semiconductor thin film 4 superposed on the gate insulation film 3O above the gate electrode 2. The semiconductor thin film 4 is constituted by a crystallized silicon thin film by means of, for example, laser annealing.

The thin film transistor includes a source region "S", a channel region "Ch" and a drain region "D" as a passage of the current supplied to the organic electroluminescent element OLED. The channel region "Ch" is located rightly above the gate electrode 2.

The thin film transistor having a bottom gate structure is covered with a first interlayer insulation film 71N made of silicon nitride, and the electrodes 5S and 5D are formed on the interlayer insulation film 71N.

The films constituting the aforesaid organic electroluminescent element OLED are formed above the electrodes 5S and 5D with a second interlayer insulation film 72O made of silicon oxide inserted between the films and the electrodes 5S and 5D. The anode "A" of the organic electroluminescent element OLED is electrically connected with the thin film transistor through the electrode 5D.

In the present embodiment, the interlayer insulation film 71N made of silicon nitride is removed from the opening region where the organic electroluminescent element OLED is disposed. On the other hand, the gate insulation film 3O made of silicon oxide and the second interlayer insulation film 72O made of the same silicon oxide are left there as they are.

Although the invention has been described in its preferred form with a certain degree of particularity, obviously many changes and variations are possible therein. It is therefore to be understood that the present invention may be practiced than as specifically described herein without departing from scope and the sprit thereof.

What is claimed is:

1. A display device comprising:
    pixels disposed in a matrix on a transparent base plate, each pixel having an opening region, in which an electro-optic element for emitting light through said base plate is formed, and a non-opening region, in which a thin film transistor for driving said electro-optic element is formed, wherein:
    said non-opening region has a first film structure including said thin film transistor,
    said opening region has a second film structure which extends from said first film structure and exists between said electro-optic element and said base plate, and
    said second film structure varies from said first film structure so as to adjust the light passing through said opening region,
    wherein said second film structure varies from said first film structure such that said a refractive index of said second film structure is closer to a refractive index of said base plate than that of said first film structure.

2. The display device according to claim 1, wherein:
    said second film structure includes one or more than one films, and
    at least one of a number, thicknesses, refractive indices and light absorption rates of films of said second film structure differs from those of said first film structure so as to adjust one of transmissivity and a color temperature of the light passing through said opening region.

3. The display device according to claim 1, wherein:
    said base plate is made of glass, and
    said first film structure includes a silicon nitride film having a refractive index different from that of the glass, and further
    the silicon nitride film is removed from said second film structure.

4. The display device according to claim 1, wherein:
    said first film structure includes at least a gate insulation film existing between an active layer and a gate electrode of said thin film transistor, an interlayer insulation film existing between said thin film transistor and its wiring, and a protection film for covering said thin film transistor, and
    at least one of said gate insulation film, said interlayer insulation film and said protection film is removed from said second film structure.

5. The display device according to claim 4, wherein one of said gate insulation film and said interlayer insulation film is removed from said second film structure in a process of forming a contact hole to one of said gate electrode and said wiring.

6. The display device according to claim 4, wherein:
    said thin film transistor has a bottom gate structure in which said active layer is superposed above said gate electrode with said gate insulation film inserted between said active layer and said gate electrode, and said wiring is formed above said active layer with said interlayer insulation film inserted between said wiring and said active layer, and further
    at least one of said gate insulation film and said interlayer insulation film is removed from said second film structure.

7. The display device according to claim 4, wherein:
    said thin film transistor has a top gate structure in which said gate electrode is superposed above said active layer with said gate insulation film inserted between said gate electrode and said active layer, and said wiring is formed above said gate electrode with said interlayer insulation film inserted between said wiring and said gate electrode, and further
    at least one of said gate insulation film and said interlayer insulation film is removed from said second film structure.

8. The display device according to claim 4, wherein said active layer is made of polycrystalline silicon.

9. The display device according to claim 4, wherein:

said protection film is made of a transparent organic resin film, and said second film structure includes the organic resin film as it is.

10. A display device manufacturing method for forming an opening region including an electro-optic element for emitting light through a transparent base plate and a non-opening region including a thin film transistor for driving said electro-optic element in each pixel disposed in a matrix on said base plate, said method comprising the steps of:

forming a first film body including said thin film transistor in said non-opening region, and forming a second film body extending from said first film body and existing between said electro-optic element and said base plate, wherein:

said second film body varies from said first film body so as to adjust the light passing through said opening region, whereby said second film structure varies from said first film structure such that said a refractive index of said second film structure is closer to a refractive index of said base plate than that of said first film structure.

11. The display device manufacturing method according to claim 10, wherein:

said second film body includes one or more than one films, and is processed so that at least one of a number, thicknesses, refractive indices and light absorption rates of films differs from those of said first film body so as to adjust one of transmissivity and a color temperature of the light passing through said opening region.

12. The display device manufacturing method according to claim 10, wherein:

said base plate is made of glass, and said first film body includes a silicon nitride film having a refractive index different from that of the glass, and further the silicon nitride film is removed from said second film structure.

13. The display device manufacturing method according to claim 10, wherein:

said first film body includes at least a gate insulation film existing between an active layer and a gate electrode of said thin film transistor, an interlayer insulation film existing between said thin film transistor and its wiring, and a protection film for covering said thin film transistor, and at least one of said gate insulation film, said interlayer insulation film and said protection film is removed from said second film body.

14. The display device manufacturing method according to claim 13, wherein one of said gate insulation film and said interlayer insulation film is removed from said second film body in a process of forming a contact hole to one of said gate electrode and said wiring.

15. The display device manufacturing method according to claim 13, wherein:

said thin film transistor has a bottom gate structure in which said active layer is superposed above said gate electrode with said gate insulation film inserted between said active layer and said gate electrode, and said wiring is formed above said active layer with said interlayer insulation film inserted between said wiring and said active layer, and further at least one of said gate insulation film and said interlayer insulation film is removed from said second film body.

16. The display device manufacturing method according to claim 13, wherein:

said thin film transistor has a top gate structure in which said gate electrode is superposed above said active layer with said gate insulation film inserted between said gate electrode and said active layer, and said wiring is formed above said gate electrode with said interlayer insulation film inserted between said wiring and said gate electrode, and further at least one of said gate insulation film and said interlayer insulation film is removed from said second film body.

17. The display device manufacturing method according to claim 13, wherein said active layer is made of polycrystalline silicon.

18. The display device manufacturing method according to claim 13, wherein:

said protection film is made of a transparent organic resin film, and said second film body includes the organic resin film as it is.

19. A liquid crystal display device including pixels disposed in a matrix on a transparent base plate, each pixel having an opening region, in which an electro-optic element for emitting light through said base plate is formed, and a non-opening region, in which a thin film transistor for driving said electro-optic element is formed, said electro-optic element being made by holding a liquid crystal material between transparent electrodes opposing to each other, said electro-optic element emitting light that has entered from one surface side of the base plate to another surface side of the base plate, wherein:

said non-opening region has a first film structure including said thin film transistor, said opening region has a second film structure extending from said first film structure and existing between said electro-optic element and said base plate, and said second film structure varies from said first film structure so as to adjust the light passing through said opening region, wherein said second film structure varies from said first film structure such that said a refractive index of said second film structure is closer to a refractive index of said base plate than that of said first film structure.

20. The liquid crystal display device according to claim 19, wherein:

said second film structure includes one or more than one films, and at least one of a number, thicknesses, refractive indices and light absorption rates of films of said second film structure differs from those of said first film structure so as to adjust one of transmissivity and a color temperature of the light passing through said opening region.

21. The liquid crystal display device according to claim 19, wherein:

said base plate is made of glass, and said first film structure includes a silicon nitride film having a refractive index different from that of the glass, and further the silicon nitride film is removed from said second film structure.

22. The liquid crystal display device according to claim 19, wherein:
said first film structure includes at least a gate insulation film existing between an active layer and a gate electrode of said thin film transistor, an interlayer insulation film existing between said thin film transistor and its wiring, and a protection film for covering said thin film transistor, and
at least one of said gate insulation film, said interlayer insulation film and said protection film is removed from said second film structure.

23. The liquid crystal display device according to claim 22, wherein one of said gate insulation film and said interlayer insulation film is removed from said second film structure in a process of forming a contact hole to one of said gate electrode and said wiring.

24. The liquid crystal display device according to claim 22, wherein:
said thin film transistor has a bottom gate structure in which said active layer is superposed above said gate electrode with said gate insulation film inserted between said active layer and said gate electrode, and said wiring is formed above said active layer with said interlayer insulation film inserted between said wiring and said active layer, and further
at least one of said gate insulation film and said interlayer insulation film is removed from said second film structure.

25. The liquid crystal display device according to claim 22, wherein:
said thin film transistor has a top gate structure in which said gate electrode is superposed above said active layer with said gate insulation film inserted between said gate electrode and said active layer, and said wiring is formed above said gate electrode with said interlayer insulation film inserted between said wiring and said gate electrode, and further
at least one of said gate insulation film and said interlayer insulation film is removed from said second film structure.

26. The liquid crystal display device according to claim 22, wherein said active layer is made of polycrystalline silicon.

27. The display device according to claim 22, wherein:
said protection film is made of a transparent organic resin film, and
said second film structure includes the organic resin film as it is.

28. A liquid crystal display device manufacturing method for forming an opening region including an electro-optic element for emitting light through a transparent base plate and a non-opening region including a thin film transistor for driving said electro-optic element in each pixel disposed in a matrix on said base plate, said electro-optic element being made by holding a liquid crystal material between transparent electrodes opposing to each other, said electro-optic element emitting light that has entered from one surface side of said base plate to another surface side of said base plate, said method comprising the steps of:
forming a first film body including said thin film transistor in said non-opening region, and
forming a second film body extending from said first film body and existing between said electro-optic element and said base plate, wherein:
said second film body varies from said first film body so as to adjust the light passing through said opening region,
whereby said second film structure varies from said first film structure such that said a refractive index of said second film structure is closer to a refractive index of said base plate than that of said first film structure.

29. The liquid crystal display device manufacturing method according to claim 28, wherein:
said second film body includes one or more than one films, and is processed so that at least one of a number, thicknesses, refractive indices and light absorption rates of films differs from those of said first film body so as to adjust one of transmissivity and a color temperature of the light passing through said opening region.

30. The liquid crystal display device manufacturing method according to claim 28, wherein:
said base plate is made of glass, and
said first film body includes a silicon nitride film having a refractive index different from that of the glass, and further
the silicon nitride film is removed from said second film structure.

31. The liquid crystal display device manufacturing method according to claim 28, wherein:
said first film body includes at least a gate insulation film existing between an active layer and a gate electrode of said thin film transistor, an interlayer insulation film existing between said thin film transistor and its wiring, and a protection film for covering said thin film transistor, and
at least one of said gate insulation film, said interlayer insulation film and said protection film is removed from said second film body.

32. The liquid crystal display device manufacturing method according to claim 31, wherein one of said gate insulation film and said interlayer insulation film is removed from said second film body in a process of forming a contact hole to one of said gate electrode and said wiring.

33. The liquid crystal display device manufacturing method according to claim 31, wherein:
said thin film transistor has a bottom gate structure in which said active layer is superposed above said gate electrode with said gate insulation film inserted between said active layer and said gate electrode, and said wiring is formed above said active layer with said interlayer insulation film inserted between said wiring and said active layer, and further
at least one of said gate insulation film and said interlayer insulation film is removed from said second film body.

34. The liquid crystal display device manufacturing method according to claim 31, wherein:
said thin film transistor has a top gate structure in which said gate electrode is superposed above said active layer with said gate insulation film inserted between said gate electrode and said active layer, and said wiring is formed above said gate electrode with said interlayer insulation film inserted between said wiring and said gate electrode, and further
at least one of said gate insulation film and said interlayer insulation film is removed from said second film body.

35. The liquid crystal display device manufacturing method according to claim 31, wherein said active layer is made of polycrystalline silicon.

36. The liquid crystal display device manufacturing method according to claim 31, wherein:

said protection film is made of a transparent organic resin film, and said second film body includes the organic resin film as it is.

37. An organic electroluminescent display device including pixels disposed in a matrix on a transparent base plate, each pixel having an opening region, in which an electro-optic element for emitting light through the base plate is formed, and a non-opening region, in which a thin film transistor for driving said electro-optic element is formed, said electro-optic element being made by holding an organic electroluminescent material between electrodes opposing to each other, said electro-optic element emitting light that has been generated by itself from one surface side of said base plate to another surface side of said base plate, wherein:

said non-opening region has a first film structure including said thin film transistor, said opening region has a second film structure extending from said first film structure and existing between said electro-optic element and said base plate, and said second film structure varying from said first film structure so as to adjust the light passing through said opening region, wherein said second film structure varies from said first film structure such that said a refractive index of said second film structure is closer to a refractive index of said base plate than that of said first film structure.

38. The organic electroluminescent display device according to claim 37, wherein:

said second film structure includes one or more than one films, and at least one of a number, thicknesses, refractive indices and light absorption rates of the films of said second film structure differs from those of said first film structure so as to adjust one of transmissivity and a color temperature of the light passing through said opening region.

39. The organic electroluminescent display device according to claim 37, wherein:

said base plate is made of glass, and said first film structure includes a silicon nitride film having a refractive index different from that of the glass, and further the silicon nitride film is removed from said second film structure.

40. The organic electroluminescent display device according to claim 37, wherein:

said first film structure includes at least a gate insulation film existing between an active layer and a gate electrode of said thin film transistor, an interlayer insulation film existing between said thin film transistor and its wiring, and a protection film for covering said thin film transistor, and at least one of said gate insulation film, said interlayer insulation film and said protection film is removed from said second film structure.

41. The organic electroluminescent display device according to claim 40, wherein one of said gate insulation film and said interlayer insulation film is removed from said second film structure in a process of forming a contact hole to one of said gate electrode and said wiring.

42. The organic electroluminescent display device according to claim 40, wherein:

said thin film transistor has a bottom gate structure in which said active layer is superposed above said gate electrode with said gate insulation film inserted between said active layer and said gate electrode, and said wiring is formed above said active layer with said interlayer insulation film inserted between said wiring and said active layer, and further at least one of said gate insulation film and said interlayer insulation film is removed from said second film structure.

43. The organic electroluminescent display device according to claim 40, wherein:

said thin film transistor has a top gate structure in which said gate electrode is superposed above said active layer with said gate insulation film inserted between said gate electrode and said active layer, and said wiring is formed above said gate electrode with said interlayer insulation film inserted between said wiring and said gate electrode, and further at least one of said gate insulation film and said interlayer insulation film is removed from said second film structure.

44. The organic electroluminescent display device according to claim 40, wherein said active layer is made of polycrystalline silicon.

45. The display device according to claim 40, wherein:

said protection film is made of a transparent organic resin film, and said second film structure includes the organic resin film as it is.

46. An organic electroluminescent display device manufacturing method for forming an opening region including an electro-optic element for emitting light through a transparent base plate and a non-opening region including a thin film transistor for driving said electro-optic element in each pixel disposed in a matrix on said base plate, said electro-optic element being made by holding an organic electroluminescent material between electrodes opposing to each other, said electro-optic element emitting light that has been generated by itself from one surface side of said base plate to another surface side of said base plate, said method comprising the steps of:

forming a first film body including said thin film transistor in said non-opening region, and forming a second film body extending from said first film body and existing between said electro-optic element and said base plate, wherein:

said second film body varies from said first film body so as to adjust the light passing through said opening region, whereby said second film structure varies from said first film structure such that said a refractive index of said second film structure is closer to a refractive index of said base plate than that of said first film structure.

47. The organic electroluminescent display device manufacturing method according to claim 46, wherein:

said second film body includes one or more than one films, and is processed so that at least one of a number, thicknesses, refractive indices and light absorption rates of films differs from those of said first film body so as to adjust one of transmissivity and a color temperature of the light passing through said opening region.

48. The organic electroluminescent display device manufacturing method according to claim 46, wherein:

said base plate is made of glass, and said first film body includes a silicon nitride film having a refractive index-different from that of the glass, and further the silicon nitride film is removed from said second film structure.

49. The organic electroluminescent display device manufacturing method according to claim 46, wherein:

said first film body includes at least a gate insulation film existing between an active layer and a gate electrode of said thin film transistor, an interlayer insulation film existing between said thin film transistor and its wiring, and a protection film for covering said thin film transistor, and at least one of said gate insulation film, said interlayer insulation film and said protection film is removed from said second film body.

50. The organic electroluminescent display device manufacturing method according to claim 49, wherein one of said gate insulation film and said interlayer insulation film is removed from said second film body in a process of forming a contact hole to one of said gate electrode and said wiring.

51. The organic electroluminescent display device manufacturing method according to claim 49, wherein:

said thin film transistor has a bottom gate structure in which said active layer is superposed above said gate electrode with said gate insulation film inserted between s aid active layer and said gate electrode, and said wiring is formed above said active layer with said interlayer insulation film inserted between said wiring and said active layer, and further at least one of said gate insulation film and said interlayer insulation film is removed from said second film body.

52. The organic electroluminescent display device manufacturing method according to claim 49, wherein:

said thin film transistor has a top gate structure in which said gate electrode is superposed above said active layer with said gate insulation film inserted between said gate electrode and said active layer, and said wiring is formed above said gate electrode with said interlayer insulation film inserted between said wiring and said gate electrode, and further at least one of said gate insulation film and said interlayer insulation film is removed from said second film body.

53. The organic electroluminescent display device manufacturing method according to claim 49, wherein said active layer is made of polycrystalline silicon.

54. The organic electroluminescent display device manufacturing method according to claim 49, wherein:

said protection film is made of a transparent organic resin film, and said second film body includes the organic resin film as it is.

* * * * *

UNITED STATES PATENT AND TRADEMARK OFFICE
CERTIFICATE OF CORRECTION

PATENT NO. : 6,674,106 B2
DATED : January 6, 2004
INVENTOR(S) : Tsutomu Tanaka

It is certified that error appears in the above-identified patent and that said Letters Patent is hereby corrected as shown below:

Column 23,
Line 5, "index-different" should read -- index different --.

Column 24,
Line 1, "between s aid" should read -- between said --.

Signed and Sealed this

Fourth Day of January, 2005

JON W. DUDAS
*Director of the United States Patent and Trademark Office*